(12) United States Patent
Iwata et al.

(10) Patent No.: US 7,315,060 B2
(45) Date of Patent: Jan. 1, 2008

(54) SEMICONDUCTOR STORAGE DEVICE, MANUFACTURING METHOD THEREFOR AND PORTABLE ELECTRONIC EQUIPMENT

(75) Inventors: Hiroshi Iwata, Nara-ken (JP); Akihide Shibata, Nara (JP); Kotaro Kataoka, Nara (JP); Masayuki Nakano, Nara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 126 days.

(21) Appl. No.: 11/142,770

(22) Filed: Jun. 2, 2005

(65) Prior Publication Data

US 2005/0280065 A1    Dec. 22, 2005

(30) Foreign Application Priority Data

Jun. 3, 2004   (JP)   ............... P2004-166359
Nov. 8, 2004   (JP)   ............... P2004-323842

(51) Int. Cl.
*H01L 29/792*   (2006.01)
(52) U.S. Cl. .............. 257/324; 257/335; 257/402; 257/348; 257/392; 257/E29.309
(58) Field of Classification Search ............... 257/324
See application file for complete search history.

(56) References Cited

U.S. PATENT DOCUMENTS 4,307,411 A    12/1981    Carnes et al.

2003/0161192 A1*   8/2003   Kobayashi et al. ......... 365/200
2005/0224859 A1   10/2005   Iwata et al.

FOREIGN PATENT DOCUMENTS

| JP | 5-81072 | B2 | 11/1993 |
|---|---|---|---|
| JP | 5-304277 | A | 11/1993 |
| JP | 9-116119 | A | 5/1997 |
| JP | 9-252059 | A | 9/1997 |
| JP | 2001-156188 | A | 6/2001 |
| JP | 2001-230332 | A | 8/2001 |
| JP | 2001-512290 | A | 8/2001 |
| JP | 2004-221546 | A | 8/2004 |
| WO | WO-03/075359 | A1 | 9/2003 |

* cited by examiner

*Primary Examiner*—Tu-Tu Ho
(74) *Attorney, Agent, or Firm*—Birch, Stewart, Kolasch & Birch, LLP

(57) ABSTRACT

A semiconductor storage device has a single gate electrode formed on a semiconductor substrate through a gate insulation film. First and second memory function bodies formed on both sides of the gate electrode. A P-type channel region is formed in a surface of the substrate on the side of the gate electrode. N-type first and second diffusion regions are formed on both sides of the channel region. The channel region is composed of an offset region located under the first and second memory function bodies and a gate electrode beneath region located under the gate electrode. The concentration of a dopant which imparts a P-type conductivity to the offset region is effectively lower than the concentration of a dopant which imparts the P-type conductivity to the gate electrode beneath region. This makes it possible to provide the semiconductor storage device which is easily shrunk in scale.

17 Claims, 21 Drawing Sheets

SEMICONDUCTOR STORAGE DEVICE, MANUFACTURING METHOD THEREFOR AND PORTABLE ELECTRONIC EQUIPMENT

CROSS-REFERENCE TO RELATED APPLICATIONS

This nonprovisional application claims priority under 35 U.S.C. §119(a) on Patent Application Nos. 2004-166359 and 2004-323842 filed in Japan on Jun. 3, 2004 and Nov. 8, 2004 respectively, the entire contents of which are hereby incorporated by reference.

BACKGROUND OF THE INVENTION

The present invention relates to a semiconductor storage device, manufacturing method therefor and portable electronic equipment. Specifically, the invention relates to a semiconductor storage device constructed of field-effect transistors including memory function bodies having a function to retain electric charge or polarization are arranged, to manufacturing method therefor and to portable electronic equipment including such a semiconductor storage device.

The following will describe a flash memory as a representative example of conventional nonvolatile memories. FIG. 32 schematically shows a cross sectional view of a flash memory as an example (refer to e.g. Japanese Patent Laid-Open Publication No. HEI 5-304277). In FIG. 32, there are shown a semiconductor substrate 901, a floating gate 902, a word line 903, a source line 904, a bit line 905, an element isolation region 906 and an insulation film 907.

The flash memory cell retains storage as the quantity of charge in the floating gate 902. In the memory cell array constructed by arranging the memory cells, the desired memory cell can be subjected to rewrite and read operations by selecting the specified word line and bit line and applying a prescribed voltage to the lines.

FIG. 42 schematically shows a drain current (Id) vs. gate voltage (Vg) characteristic when the quantity of charges in the floating gate 902 changes. As the quantity of charges in the floating gate increases, the threshold voltage increases, and the Id-Vg curve is displaced roughly parallel in a direction in which the gate voltage Vg increases with respect to same drain current Id, resulting in a curve shown in broken line.

However, in the aforementioned conventional flash memory that has the floating gate between the word line (gate electrode) and the channel region, because it is necessary to prevent leakage of electric charges from the floating gate 902, it has been difficult to reduce the thickness of an insulation film 907 that isolates the floating gate 902 from the word line 903 and an insulation film 908 that isolate the floating gate 902 from the channel region. Therefore, it has been difficult to reduce the thickness of a practically gate insulation film, and this has hindered the miniaturization of the memory cell.

SUMMARY OF THE INVENTION

An object of the present invention is to provide a semiconductor storage device which is easily shrunk in scale.

In order to achieve the above-mentioned object, a first aspect of the present invention provides a semiconductor storage device comprising:

a semiconductor layer;
a gate insulation film formed on the semiconductor layer
a single gate electrode formed on the gate insulation film;
a memory function body that is formed on both sides of the gate electrode and has a function to retain electric charge;
a first conductivity-type channel region formed in a surface portion of the semiconductor layer on a side of the gate electrode;
a second conductivity-type diffusion region formed on both sides of the channel region;
a first conductivity-type first region formed in the channel region in a vicinity of an interface between the channel region and the memory function body; and
a first conductivity-type second region formed in the channel region in a vicinity of an interface between the channel region and the gate insulation film, wherein
a concentration of a dopant which imparts the first conductivity type to the first region is effectively lower than a concentration of a dopant which imparts the first conductivity type to the second region.

According to the semiconductor storage device of this structure, the memory function body having a function to retain electric charge is formed on both the sides of the gate electrode. The memory function body is separated from the gate insulation film. In other words, the memory function body is formed independently of the gate insulation film. This makes it possible to reduce the thickness of the gate insulation film so as to suppress the short-channel effect. Therefore, the semiconductor storage device may be shrunk in scale.

Also, forming the memory function body on both the sides of the gate electrode allows independent operation of each memory function body, and therefore two-bit operation becomes possible.

Moreover, one memory function body and the other memory function body are separated by the gate electrode, and therefore, it becomes possible to effectively suppress interference between the memory function bodies during rewrite operation.

Since the concentration of the dopant which imparts the first conductivity type to the first region is effectively lower than the concentration of the dopant which imparts the first conductivity type to the second region, reduction in memory window caused by the rewrite operation is suppressed. This makes it possible to enhance the read speed and to increase the number of rewritable operations.

Moreover, since the concentration of the dopant which imparts the first conductivity type to the first region is effectively lower than the concentration of the dopant which imparts the first conductivity type to the second region, it becomes possible to suppress variation in characteristic caused by variation in manufacturing process, thereby allowing the yield to be improved.

A second aspect of the present invention provides a semiconductor storage device comprising:

a semiconductor layer;
a gate insulation film formed on the semiconductor layer
a single gate electrode formed on the gate insulation film;
a memory function body formed on both sides of the gate electrode and having a function to retain electric charge;
a first conductivity-type channel region formed in a surface portion of the semiconductor layer on a side of the gate electrode; and
a second conductivity-type diffusion region formed on both sides of the channel region, wherein
a concentration of a dopant which imparts the first conductivity type to the first region effectively increases starting from a PN junction between the channel region and the diffusion region toward a region under the gate insulation film.

According to the semiconductor storage device of this structure, the memory function body having a function to retain electric charge is formed on both the sides of the gate electrode. The memory function body is separated from the gate insulation film. In other words, the memory function body is formed independently of the gate insulation film. This makes it possible to reduce the thickness of the gate insulation film so as to suppress the short-channel effect. Therefore, the semiconductor storage device may be shrunk in scale.

Also, forming the memory function body on both the sides of the gate electrode allows independent operation of each memory function body, and therefore two-bit operation becomes possible.

Moreover, one memory function body and the other memory function body are separated by the gate electrode, and therefore, it becomes possible to effectively suppress interference between the memory function bodies during rewrite operation.

Since the concentration of dopant which imparts the first conductivity type to the channel region becomes effectively higher from the PN junction between the channel region and the diffusion region toward the region under the gate insulation film, reduction in memory window caused by the write operation is suppressed. This makes it possible to enhance the read speed and to increase the number of rewritable operations.

Moreover, since the concentration of dopant which imparts the first conductivity type to the channel region becomes effectively higher from the PN junction between the channel region and the diffusion region toward the region under the gate insulation film, it becomes possible to suppress variation in characteristic caused by variation in manufacturing process, thereby allowing the yield to be improved.

A third aspect of the present invention provides a semiconductor storage device comprising:

a semiconductor layer;

a gate insulation film formed on the semiconductor layer;

a single gate electrode formed on the gate insulation film;

a memory function body that is formed on both sides of the gate electrode and has a function to retain electric charge;

a first conductivity-type channel region formed in a surface portion of the semiconductor layer on a side of the gate electrode; and a second conductivity-type diffusion region formed on both sides of the channel region, wherein when potential of the gate electrode and potential of the diffusion region are set to be equal, a depletion layer formed in a PN junction between the channel region and the diffusion region and a depletion layer formed under the gate electrode are connected in a vicinity of an interface between the channel region and the memory function body.

According to the semiconductor storage device of this structure, the memory function body having a function to retain electric charge is formed on both the sides of the gate electrodes. The memory function body is separated from the gate insulation film. In other words, the memory function body is formed independently of the gate insulation film. This makes it possible to reduce the thickness of the gate insulation film so as to suppress the short-channel effect. Therefore, the semiconductor storage device may be shrunk in scale.

Moreover, forming the memory function body on both the sides of the gate electrode allows independent operation of each memory function body, and therefore two-bit operation becomes possible.

Moreover, since one memory function body and the other memory function body are separated by the gate electrode, it becomes possible to effectively suppress interference between the memory function bodies during rewrite operation.

Moreover, when potential of the gate electrode and potential of the diffusion region are set to be equal, a depletion layer formed in a PN junction between the channel region and the diffusion region and a depletion layer formed under the gate electrode are connected in the vicinity of an interface between the channel region and the memory function body, which suppresses reduction in memory window caused by the rewrite operation. This makes it possible to enhance the read speed and to increase the number of rewritable operations.

Moreover, when potential of the gate electrode and potential of the diffusion region are set to be equal, a depletion layer formed in a PN junction between the channel region and the diffusion region and a depletion layer formed under the gate electrode are connected in the vicinity of an interface between the channel region and the memory function body, which makes it possible to suppress variation in characteristic caused by variation in manufacturing process, thereby allowing the yield to be improved.

The semiconductor storage device according to one embodiment of the present invention further comprises a third region formed under the first region so as to be in contact with the first region, wherein a concentration of a dopant which imparts the first conductivity type to the third region is effectively higher than the concentration of the dopant which imparts the first conductivity type to the second region.

According to the semiconductor storage device of this structure, a concentration of a dopant which imparts the first conductivity type to the third region which is in contact with the lower portion of the first region is effectively higher than the concentration of the dopant which imparts the first conductivity type to the second region, which makes it possible to increase the generation efficiency of hot carriers during the rewrite operation. Therefore, it becomes possible to suppress deterioration attributed to the repetition of the rewrite operation and to achieve high-speed rewrite operation.

In the semiconductor storage device according to one embodiment of the present invention, a concentration of a dopant which imparts the first conductivity type to a portion of the third region with a depth of 10 nm to 80 nm is effectively higher than a concentration of a dopant which imparts the first conductivity type to other portions of the third region.

According to the semiconductor storage device in this embodiment, a concentration of a dopant which imparts the first conductivity type to a portion of the third region with a depth of 10 nm to 80 nm is effectively higher than a concentration of a dopant which imparts the first conductivity type to other portions of the third region, which allows the channel region in the vicinity of the interface between the semiconductor layer and the memory function body to have a sufficiently low dopant concentration and makes it possible to efficiently inject the generated hot carriers into the memory function body. Therefore, it becomes possible to suppress deterioration attributed to the repetition of the rewrite operation and to achieve high-speed rewrite operation.

The semiconductor storage device according to one embodiment of the present invention further comprises a fourth region formed under the diffusion region so as to be in contact with the diffusion region, wherein a concentration of a dopant which imparts the first conductivity type to the fourth region is effectively lower than the concentration of the dopant which imparts the first conductivity type to the second region.

According to the semiconductor storage device in this embodiment, since a concentration of a dopant which imparts the first conductivity type to the fourth region which is in contact with the lower portion of the diffusion region is effectively lower than the concentration of the dopant which imparts the first conductivity type to the second region, a junction capacitance with respect to the second conductivity-type diffusion region can be reduced drastically so that high-speed read operation can be achieved. Therefore, it becomes possible to suppress deterioration attributed to the repetition of the rewrite operation and to achieve high-speed rewrite operation.

In the semiconductor storage device according to one embodiment of the present invention, the gate insulation film includes a dielectric film larger in dielectric constant than a silicon oxide.

According to the semiconductor storage device of this embodiment, the gate insulation film including a dielectric film larger in dielectric constant than the silicon oxide makes it possible to decrease an equivalent oxide thickness of the gate insulation film without changing its physical film thickness. Particularly, it becomes possible to decrease an effective thickness of the gate insulation film without deteriorating electric characteristics of the gate insulation film.

Therefore, it becomes possible to further suppress the short-channel effect by decreasing an equivalent oxide thickness of the gate insulation film while keeping the voltage withstand level of the gate insulation film. As a result, the semiconductor storage device of the present invention which is easily shrunk in scale compared to the conventional semiconductor storage device can be further shrunk in scale in a dramatic way.

In the semiconductor storage device according to one embodiment of the present invention, the dielectric film is made of a hafnium compound.

According to the semiconductor storage device of this embodiment, the dielectric film is made of a hafnium compound so that a high dielectric constant can be maintained even with the scale shrinkage of the semiconductor storage device. Therefore, even though the semiconductor storage device is shrunk in scale, high-speed read operation may be achieved by increasing a read current.

Moreover, since the hafnium compound has high thermal stability, it has high compatibility with a silicon process so that the manufacturing process is facilitated.

A fourth aspect of the present invention provides a semiconductor storage device comprising:

a semiconductor layer;

a gate insulation film formed on the semiconductor layer;

a single gate electrode formed on the gate insulation film;

a memory function body formed on both sides of the gate electrode and having a function to retain electric charge;

a first conductivity-type channel region formed in a surface portion of the semiconductor layer on a side of the gate electrode; and a second conductivity-type diffusion region formed on both sides of the channel region, wherein the gate insulation film includes a first insulation film and a second insulation film which is formed on the first insulation film and is larger in dielectric constant than the first insulation film.

According to the semiconductor storage device of this structure, the memory function body having a function to retain electric charge is formed on both the sides of the gate electrode. The memory function body is separated from the gate insulation film. Particularly, the memory function body is formed independently of the gate insulation film. This makes it possible to reduce the thickness of the gate insulation film so as to suppress the short-channel effect. Therefore, the semiconductor storage device may be shrunk in scale.

Moreover, forming the memory function body on both the sides of the gate electrode allows independent operation of each memory function body, and therefore two-bit operation becomes possible.

Moreover, since one memory function body and the other memory function body are separated by the gate electrode, it becomes possible to effectively suppress interference between the memory function bodies during rewrite operation.

Moreover, since the gate insulation film includes the first insulation film and the second insulation film which is formed on the first insulation film and is higher in a dielectric constant than the first insulation film, it becomes possible to keep the interface between the gate insulation film and the semiconductor layer at high quality while decreasing an equivalent oxide thickness of the gate insulation film. Particularly, charge mobility can be enhanced and deterioration of the interface can be suppressed more in the case where the first insulation film having a low dielectric constant is formed in between the second insulation film having a high dielectric constant and the semiconductor layer than in the case where the second insulation film having a high dielectric constant and the semiconductor layer are in direct contact with each other. Therefore, the read operation speed of the semiconductor storage device may be increased and the reliability may be enhanced.

A fifth aspect of the present invention provides a manufacturing method for the semiconductor storage device as defined in claim 1, comprising the steps of:

forming the gate electrode;

injecting a dopant imparting the second conductivity-type into the semiconductor layer; and forming the memory function body.

According to the manufacturing method for the semiconductor storage device in the aforementioned structure, the dopant imparting the second conductivity-type is injected into the semiconductor layer before the memory function body is formed, so that the first and second regions may be formed in a self-aligning way. This makes it possible to easily form the semiconductor storage device which supports the high-speed read operation and a number of rewrite operations.

A sixth aspect of the present invention provides a manufacturing method for the semiconductor storage device as defined in claim 4, comprising the steps of:

forming the gate electrode;

injecting a dopant imparting the first conductivity-type into the semiconductor layer while injecting a dopant imparting the second conductivity-type into the semiconductor layer so as to be smaller in thickness than the dopant imparting the first conductivity-type; and forming the memory function body.

According to the manufacturing method for the semiconductor storage device of the aforementioned structure, before the memory function body is formed, the dopant imparting the first conductivity-type is injected into the semiconductor layer while the dopant imparting the second conductivity-type is injected into the semiconductor layer so as to be shallower than the dopant imparting the first conductivity-type, so that the first to third regions may be formed in a self-aligning way. This makes it possible to easily form the semiconductor storage device which can suppress deterioration attributed to the repetition of the rewrite operation and achieves high-speed rewrite operation.

In the manufacturing method for the semiconductor storage device according to one embodiment of the present invention, the dopant imparting the second conductivity-type is antimony.

According to the manufacturing method for the semiconductor storage device in this embodiment, the dopant imparting the second conductivity-type is antimony, which makes it possible to more efficiently suppress deterioration attributed to the repetition of the rewrite operation and to achieve high-speed rewrite operation.

A seventh aspect of the present invention provides portable electronic equipment comprising the semiconductor storage device as defined in any one of the fist to third aspects of the present invention.

According to the portable electronic equipment of this structure, having the semiconductor storage device as defined in any one of the first to third aspects of the invention allows reduction in manufacturing cost for, for example, control circuits. Therefore, the cost of the portable electronic equipment itself can be reduced. Alternatively, the capacity of, for example, a nonvolatile memory included in the control circuit may be increased so as to upgrade the functions of the portable electronic equipment.

According to the first aspect of the present invention, again, it is possible to shrink in scale the semiconductor storage device because thickness of the gate insulation film is reduced to suppress the short-channel effect by forming the memory function body independently of the gate insulation film.

Also, the memory function body is formed on both the sides of the gate electrode. This allows independent operation of each memory function body, and therefore two-bit operation becomes possible.

Moreover, one memory function body and the other memory function body are separated by the gate electrode. Therefore, it becomes possible to effectively suppress interference between the memory function bodies during rewrite operation.

The concentration of the dopant which imparts the first conductivity type to the first region is effectively lower than the concentration of the dopant which imparts the first conductivity type to the second region. Therefore, reduction in memory window caused by the rewrite operation is suppressed. This makes it possible to enhance the read speed and to increase the number of rewritable operations.

Also, it becomes possible to suppress variation in characteristic caused by variation in manufacturing process, thereby allowing the yield to be improved.

According to the second aspect of the present invention, the memory function body is formed independently of the gate insulation film. This makes it possible to reduce the thickness of the gate insulation film so as to suppress the short-channel effect. Therefore, the semiconductor storage device may be shrunk in scale.

Also, forming the memory function body on both the sides of the gate electrode allows independent operation of each memory function body, and therefore two-bit operation becomes possible.

Moreover, one memory function body and the other memory function body are separated by the gate electrode, and therefore, it becomes possible to effectively suppress interference between the memory function bodies during rewrite operation.

The concentration of dopant which imparts the first conductivity type to the channel region becomes effectively higher from the PN junction between the channel region and the diffusion region toward the region under the gate insulation film. Therefore, reduction in memory window caused by the write operation is suppressed. This makes it possible to enhance the read speed and to increase the number of rewritable operations.

Moreover, since the concentration of dopant which imparts the first conductivity type to the channel region becomes effectively higher from the PN junction between the channel region and the diffusion region toward the region under the gate insulation film, it becomes possible to suppress variation in characteristic caused by variation in manufacturing process, thereby allowing the yield to be improved.

According to the third aspect of the present invention, the memory function body is formed independently of the gate insulation film. This makes it possible to reduce the thickness of the gate insulation film so as to suppress the short-channel effect. Therefore, the semiconductor storage device may be shrunk in scale.

Also, forming the memory function body on both the sides of the gate electrode allows independent operation of each memory function body, and therefore two-bit operation becomes possible.

Moreover, since one memory function body and the other memory function body are separated by the gate electrode, it becomes possible to effectively suppress interference between the memory function bodies during rewrite operation.

Further, when potential of the gate electrode and potential of the diffusion region are set to be equal, a depletion layer formed in a PN junction between the channel region and the diffusion region and a depletion layer formed under the gate electrode are connected in the vicinity of an interface between the channel region and the memory function body, which suppresses reduction in memory window caused by the rewrite operation. This makes it possible to enhance the read speed and to increase the number of rewritable operations.

Furthermore, this makes it possible to suppress variation in characteristic caused by variation in manufacturing process, thereby allowing the yield to be improved.

According to the fourth aspect of the present invention, the memory function body is formed independently of the gate insulation film. This makes it possible to reduce the thickness of the gate insulation film so as to suppress the short-channel effect. Therefore, the semiconductor storage device may be shrunk in scale.

Also, forming the memory function body on both the sides of the gate electrode allows independent operation of each memory function body, and therefore two-bit operation becomes possible.

Moreover, since one memory function body and the other memory function body are separated by the gate electrode, it becomes possible to effectively suppress interference between the memory function bodies during rewrite operation.

Further, since the gate insulation film includes the first insulation film and the second insulation film which is formed on the first insulation film and is higher in a dielectric constant than the first insulation film, it becomes possible to keep the interface between the gate insulation film and the semiconductor layer at high quality while decreasing an equivalent oxide thickness of the gate insulation film. Therefore, the read operation speed of the semiconductor storage device may be increased and the reliability may be enhanced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
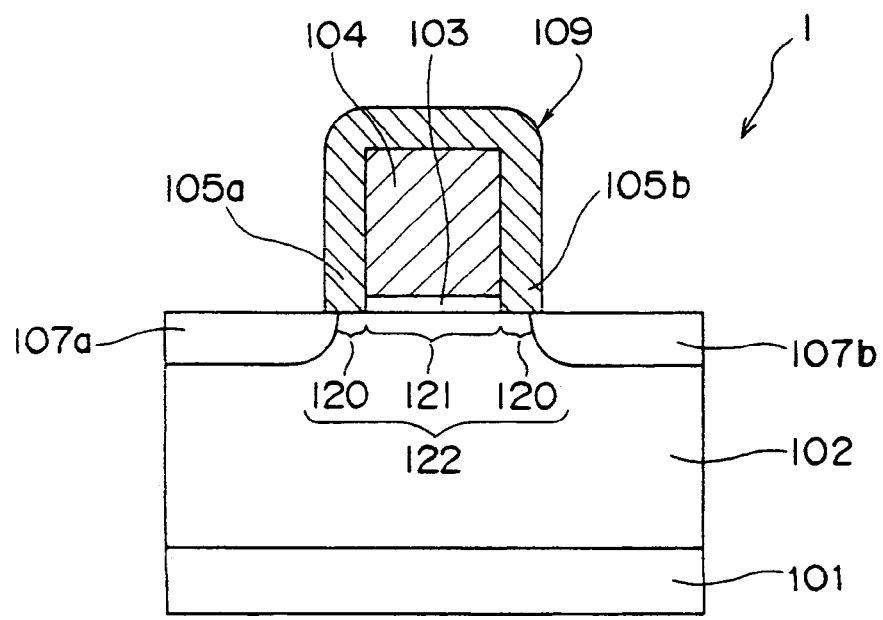
FIG. 1 is a schematic sectional view of a memory element in the semiconductor storage device of a first reference example of the present invention.

An outline of a memory element to be employed in the semiconductor storage device of the present invention will be described first.

The memory element employed in the semiconductor storage device of the present invention is constructed mainly of first conductivity type regions that are diffusion regions, a second conductivity type region, charge storage regions each straddling the border between the first and second conductivity type regions, and a gate electrode (or word line) on a gate insulation film, or mainly of a semiconductor layer, a gate insulation film, a gate electrode (or word line) on the gate insulation film, a memory function body on both sides of the gate electrode (or word line), a channel region, and diffusion regions on both sides of the channel region. Herein, the channel region generally means a region which is, generally, of the same conductive type as that of the semiconductor layer and is located right under the gate electrode (or word line), while the diffusion region means a region of a conductive type opposite to that of the channel region.

The memory element functions as a memory element storing four-valued or more information by storing binary or more information in one charge retention film. The memory element also functions as a memory cell having a selector transistor function and a memory transistor function because of the variable resistance effect of the memory function body. However, the memory element does not necessarily need to store four-valued or more information, but it may also function to store, for example, binary information.

It is preferable that the semiconductor storage device of the present invention is formed on a semiconductor substrate as the semiconductor layer, preferably in a first conductivity type well region formed in the semiconductor substrate.

The semiconductor substrate is not limited to particular ones as far as it is applicable to semiconductor apparatuses, and it is possible to use various substrates such as bulk substrates made from elemental semiconductors such as silicon and germanium, or compound semiconductors such as SiGe, GaAs, InGaAs, ZnSe, and GaN; SOI (Silicon on Insulator) substrates; SOS (Silicon on Sapphire) substrates, and multilayer SOI substrates, and substrates having a semiconductor layer on a glass or plastic substrate. Among others, a silicon substrate or an SOI substrate having a silicon layer formed as a surface semiconductor layer is preferable. The semiconductor substrate or the semiconductor layer may be monocrystal (e.g., a single crystal obtained by epitaxial growth), polycrystalline, or amorphous, though a current amount flowing inside will be slightly different among them.

In the semiconductor layer, it is preferable that device isolation regions are formed. Elements such as transistors, capacitors and resistors, circuits composed of such elements, semiconductor devices, and an inter-layer insulating film or films may be formed in combination in a single or a multilayer structure on the semiconductor substrate or the semiconductor layer. It is noted that the device isolation regions may be formed by any of various device isolation films including a LOCOS (local oxidation of silicon) film, a trench oxide film, and an STI (Shallow Trench Isolation) film. The semiconductor layer may be either of a P-type or an N-type conductivity type, and it is preferable that at least one first conductivity type (P-type or N-type) well region is formed in the semiconductor substrate. Acceptable impurity concentrations of the semiconductor layer and the well region are those within the range known in the art. It is noted that in the case of using an SOI substrate as the semiconductor layer, a well region may be formed in the surface semiconductor layer, and also a body region may be provided under the channel region.

Materials of the gate insulating film or the insulation film are not particularly limited as far as they are usable in typical semiconductor apparatuses. For example, insulating films including a silicon oxide film and a silicon nitride film, and high-dielectric films including aluminum oxide films, titanium oxide films, tantalum oxide films, hafnium oxide films are usable in the form of a single-layer film or a multi-layer film. Among others, the silicon oxide film is preferable. An appropriate thickness of the gate insulating film is, for example, approx. 1 to 20 nm, preferably 1 to 6 nm. The gate insulating film may be only formed right under the gate electrode, or may be formed to be larger (in width) than the gate electrode.

The gate electrode or word line is formed on the gate insulation film normally in a shape for use in a semiconductor device or a shape that has a concave portion in a lower end portion. Herein, the "single gate electrode" is defined as a gate electrode consisting of a monolayer or multilayer conductive film and formed into a single inseparable piece. In other words, the single gate electrode is defined as a monolayer conductive film or multilayer conductive film that is formed in an inseparably integrated shape. The gate electrode may have a side wall insulation film on each side surface. The gate electrode is normally not specifically limited so long as it is used for a semiconductor device, and there can be enumerated conductive films of: polysilicon; metals including copper and aluminum; high-melting metals including tungsten, titanium, and tantalum; and silicides of high-melting metals, in the form of a single-layer or a multi-layer. The gate electrode should properly be formed with a film thickness of, for example, about 50 to 400 nm. It is to be noted that a channel region is formed under the gate electrode.

The memory function body has at least a function to retain electric charges (hereinafter referred to as a "charge retention function"). In other words, the memory function body includes a film or region that has a function to store and retain charges, trap charges or retain a charge polarized state. Materials implementing these functions include: silicon nitride; silicon; silicate glass including impurities such as phosphorus or boron; silicon carbide; alumina; high-dielectric substances such as hafnium oxide, zirconium oxide, or tantalum oxide; zinc oxide; and metals. The memory function body may be formed into single-layer or multi-layer structure of: for example, an insulating film containing a silicon nitride film; an insulating film incorporating a conductive film or a semiconductor layer inside; and an insulating film containing one or more conductor dots or semiconductor dots. Among these, the silicon nitride is preferable because it can achieve a large hysteresis property by the presence of a number of levels for trapping electric charges, and has good holding characteristics in that the electric-charge holding time is long and that there hardly occurs leakage of electric charges caused by generation of leakage paths, and further because it is a material normally used in LSI process.

Use of an insulating film containing inside an insulating film having a charge holding function such as a silicon nitride film enables increase of reliability relating to memory holding. Since the silicon nitride film is an insulator, electric charges of the entire silicon nitride film will not be immediately lost even if part of the electric charges are leaked. Further, in the case of arraying a plurality of memory elements, even if the distance between the memory elements is shortened and adjacent memory function bodies come into contact with each other, information stored in each memory function body is not lost unlike the case where the memory function body is made from a conductor. Also, it becomes possible to dispose a contact plug closer to the memory function body, or in some cases it becomes possible to dispose the contact plug so as to overlap with the memory function body, which facilitates miniaturization of the memory elements.

For further increase of the reliability relating to the memory holding, the insulator having a function of holding electric charges is not necessarily needed to be in the film shape, and insulators having the function of holding an electric charge may preferably be present in an insulating film in a discrete manner. Specifically, such insulators may be dispersed like dots within a material having difficulty in holding electric charges, such as silicon oxide.

Also, use of an insulator film containing inside a conductive film or a semiconductor layer as a charge holding portion enables free control of the quantity of electric charges injected into the conductor or the semiconductor, thereby bringing about an effect of facilitating achieving a multi-valued memory cell.

Further, using an insulator film containing one or more conductor or semiconductor dots as a memory function body facilitates execution of write and erase by direct tunneling of electric charges, thereby bringing about an effect of reduced power consumption.

Moreover, it is acceptable to use, as a memory function body, a ferroelectric film such as PZT (lead zirconate titanate) and PLZT (lead lanthanum zirconate titanate) whose polarization direction is changed by an electric field. In this case, electric charges are substantially generated by polarization on the surface of the ferroelectric film and retained in the state. Therefore, electric charges are supplied from outside the film that has the memory function, and a hysteresis characteristic similar to that of the film that traps electric charges can be obtained. In addition, since there is no need to inject electric charges from outside the film and the hysteresis characteristic can be obtained only by the polarization of the electric charges in the film, high-speed write and erase is achievable.

It is preferable that the memory function body further contains a region that obstructs escape of electric charges or a film having a function of obstructing escape of electric charges. Materials fulfilling the function of obstructing escape of electric charges include a silicon oxide.

Preferably, the charge retention film contained in the memory function body is formed on both sides of the gate electrode directly or through an insulating film, and it is disposed on the semiconductor substrate (a well region, a body region, or a source/drain region or a diffusion layer region) through the gate insulating film or the insulating film. The charge retention films on both sides of the gate electrode are preferably formed so as to cover all or part of side surfaces of the gate electrode directly or through the insulating film. In an application where the gate electrode has a recess portion on the lower edge side, the charge retention film may be formed so as to fill the entire recess portion or part of the recess portion directly or through the insulating film.

Preferably, the gate electrode is formed only on the side surface of the memory function body, or the upper portion of the charge holding portion is not covered with the gate electrode. In such arrangement, it becomes possible to dispose a contact plug closer to the gate electrode, which facilitates miniaturization of the memory elements. Also, the memory elements having such simple disposition are easily manufactured, resulting in an increased yield.

If a conductive film or a semiconductor film is used as a charge retaining film, it is preferable to place such a film via an insulation film such that the charge retaining film does not touch the conductive film (semiconductor substrate, well region, body region, source/drain region, or diffusion region) or the gate electrode. For example, there may be a stacked structure of a conductive film and an insulation film, a structure in which dots of a conductive film is scattered in an insulation film, a structure in which the conductive or semiconductor charge retention film is included in a side wall insulation film on a side surface of the gate, etc.

The diffusion region can be made to function as a source/drain region and has a conductivity type opposite to that of the semiconductor layer or the well region. A junction of the diffusion region and the semiconductor layer or the well region should preferably have a steep slope of impurity concentration. The reason for the above is that hot electrons and hot holes are efficiently generated at a low voltage, and high-speed operation can be achieved at a lower voltage. The junction depth of the diffusion region is not specifically limited and is allowed to be properly adjusted according to the performance and so on of the semiconductor storage device desired to be obtained. When a SOI substrate is employed as a semiconductor substrate, the diffusion region may have a junction depth smaller than the film thickness of the surface semiconductor layer. However, the diffusion region should preferably have a junction depth almost equal to the film thickness of the surface semiconductor layer.

The diffusion region may be arranged so as to overlap with the gate electrode end or arranged so as to meet the gate electrode end or arranged so as to be offset with respect to the gate electrode end. In particular, in the case of offset, the easiness of inversion of the offset region under the charge retaining film is largely changed by the quantity of charges accumulated in the memory function body when the voltage is applied to the gate electrode, increasing the memory effect and reducing the short-channel effect. Therefore, this arrangement is preferable. However, since a drive current between the diffusion regions (source and drain) is significantly reduced if the offset is excessive, it is preferred that the amount of offset, i.e., a distance from one gate electrode end to the nearer diffusion region in the direction of the gate length should preferably be shorter than the thickness of the charge retaining film in the direction parallel to the gate length direction. What is particularly important is that at least part of the film or region having the charge retention function in the memory function body overlaps with part of the diffusion region. The reason for the above is that the essence of the memory elements that constitute the semiconductor storage device of the present invention is to rewrite the storage by the electric field intersecting the memory function body due to a voltage difference between the gate electrode and the diffusion region existing only in the side wall portion of the memory function body.

Of the two diffusion regions, only one diffusion region may be offset from the corresponding gate end. However, it is preferable that both the diffusion regions are offset.

If both of the diffusion regions are offset, it is possible for one memory element to store 2-bit information. Also, because both of the diffusion regions are offset, it is possible to suppress the short channel effect much more effectively than when only one diffusion region is offset. Furthermore, a process, which would be required when only one diffusion region is offset, is eliminated, which in turn dispenses with a margin required when the above process is added. As is apparent from the above, because the diffusion regions are both offset, the memory elements and memory cell array are easy to miniaturize, so that higher integration is achievable. Also, the production cost can be reduced.

The diffusion region may be partially extended to a position higher than the surface of the channel region, i.e., the lower surface of the gate insulation film. In this case, it is proper that a conductive film integrated with this diffusion region is constructed while being laminated on the diffusion region formed in the semiconductor substrate. As the conductive film, there can be enumerated, for example, semiconductor of polysilicon, amorphous silicon or the like, silicide, aforementioned metals, high-melting-point metals and so on. Among others, polysilicon is preferable. The reason for the above is that the polysilicon, of which the impurity diffusion speed is significantly greater than that of the semiconductor layer, easily tolerates a shallowed junction depth of the diffusion region in the semiconductor layer and easily suppresses the short-channel effect. In this case, it is preferable to provide an arrangement that part of this diffusion region and the gate electrode hold at least part of the memory function body therebetween.

The memory element used for the semiconductor of the present invention can be formed by the ordinary semiconductor process according to a method similar to the method of forming a side wall spacer of a single layer or laminate structure on the side wall of the gate electrode or word line. In concrete, there can be enumerated: a method comprising forming a gate electrode or a word line, thereafter forming a single layer film or multilayer film including a charge retaining film, such as a charge retaining film, a charge retaining film/insulation film, an insulation film/charge retaining film, and an insulation film/charge retaining film/insulation film, and leaving the film or films in a side wall spacer shape by etching back under appropriate conditions; a method comprising forming an insulation film or a charge retaining film, leaving the film in a side wall spacer shape by etching back under appropriate conditions, further forming a charge retaining film or insulation film and leaving the film in a side wall spacer shape by etching back under appropriate conditions; a method comprising coating or depositing, on a semiconductor wafer including a gate electrode, an insulation film material in which a particulate charge retaining material is distributed, and leaving the insulation film material in a side wall spacer shape by etching back under appropriate conditions; a method comprising forming a gate electrode, thereafter forming the single layer film or the multilayer film and carrying out patterning by using a mask, and so on. Moreover, there can be enumerated a method comprising forming a charge retaining film, a charge retaining film/insulation film, an insulation film/charge retaining film, or an insulation film/charge retaining film/insulation film before forming a gate electrode or an electrode, forming an opening through the film or films in a region that becomes a channel region, forming a gate electrode material film on the entire upper surface of the wafer and patterning this gate electrode material film in a shape, which is larger than the opening in size and encompasses the opening.

One example of the formation process of this memory element will be described.

First, a gate insulation film and a gate electrode are formed on a semiconductor substrate according to a well-known procedure. Subsequently, a silicon oxide film is formed by the thermal oxidation method to a film thickness of 0.8 to 20 nm, or more preferably to a film thickness of 3 to 10 nm or deposited by the CVD (Chemical Vapor Deposition) method on the entire upper surface of the semiconductor substrate. Next, a silicon nitride film is deposited by the CVD method to a film thickness of 2 to 15 nm or more preferably to a film thickness of 3 to 10 nm on the entire upper surface of the silicon oxide film. Further, a silicon oxide film is deposited to a film thickness of 20 to 70 nm on the entire surface of the silicon nitride film by the CVD method.

Subsequently, by etching back the silicon oxide film/silicon nitride film/silicon oxide film by anisotropic etching, a memory function body appropriate for storage is formed in a side wall spacer shape on the side wall of the gate electrode.

Subsequently, by injecting ions using the gate electrodes and the memory function body in the side wall spacer shape used as a mask, a diffusion region (source/drain region) is formed. Subsequently, it is proper to carry out a silicide process or an upper portion wiring process according to a well-known procedure.

When a memory cell array is constructed by arranging the memory elements of the present invention, the best mode of the memory elements is to satisfy, for example, all the following requirements (1) to (10):

(1) The function of a word line is possessed by the integrated body of the gate electrodes of a plurality of memory elements;

(2) Formed on each of opposite sides of the word line is a memory function body that continuously extends along the word line;

(3) A material that retains electric charges in the memory function body is an insulator, and in particular, a silicon nitride film;

(4) The memory function bodies are constructed of an ONO (Oxide Nitride Oxide) film, and the silicon nitride film has a surface roughly parallel to the surface of the gate insulation film;

(5) The silicon nitride film in each memory function body is separated from the word line and the channel region by the silicon oxide film;

(6) A region having a function of retaining charges (e.g., a region formed of silicon nitride film) in each memory function body overlaps with the corresponding diffusion region;

(7) The thickness of the insulation film, which separates the silicon nitride film that has a surface roughly parallel to the surface of the gate insulation film from the channel region or the semiconductor layer differs from the thickness of the gate insulation film;

(8) Write and erase operations of one memory element are executed by a single word line;

(9) There is no electrode (word line), on each memory function body, which has a function to assist the write and erase operations; and

(10) A portion put in contact with the diffusion region right under each memory function body has a region where the impurity concentration of the conductivity type opposite to the conductivity type of the diffusion region is high.

The memory elements used for the semiconductor of the present invention are not necessarily required to satisfy all of the requirements (1) to (10), but may satisfy at least one of the requirements (1) to (10).

When some of the above requirements (1) to (10) are satisfied, there are most preferable combinations of requirements. For example, a most preferable combination resides in that the requirement (3) a material that retains electric charges in the memory function body is an insulator, and in particular, a silicon nitride film; the requirement (9) there is no electrode (word line), on each memory function body, which has a function to assist the write and erase operations; and the requirement (6) a region having a function of retaining charges (e.g., a region formed of silicon nitride film) in each memory function body overlaps with the corresponding diffusion region. That is, it is most preferable that the memory element used for the semiconductor of the present invention meets the requirements (3), (9) and (6).

When the requirement (3) and the requirement (9) are satisfied, the following great advantages are obtained. First, a bit line contact can be arranged closer to the memory function body located on the word line side wall, or even if the memory elements are put close to each other in distance, the plurality of memory function bodies do not interfere with one another, and the storage information can be retained. Therefore, the miniaturization of the memory elements is facilitated. When the charge retaining region in the memory function body consists of a conductor, interference occurs between the adjacent charge retaining regions by capacitive coupling as the distance between the memory elements is reduced, and the storage information cannot be retained.

Moreover, when the charge retaining region in the memory function body consists of an insulator (e.g., silicon nitride film), there is no need to make the memory function bodies of one memory cell independent of those of another memory cell. For example, the memory function body continuously formed on both sides of and along one word line shared by a plurality of memory cells are not required to be isolated every memory cell, and it is possible to share the memory function body formed on both sides of one word line by a plurality of memory cells that share the word line. Therefore, the photolithography and etching process for isolating the memory function bodies become unnecessary, and the manufacturing process is simplified. Furthermore, the alignment margin for the photolithography process and the film etching margin become unnecessary. Therefore, the margin between the memory cells can be reduced. Therefore, in comparison with the case where the charge retaining region in the memory function body consists of a conductor (e.g., polycrystalline silicon film), the memory cell occupation area can be miniaturized even if the same microfabrication level is applied. The case where the charge retaining region in the memory function body consists of a conductor would need the photolithography and etching process for separating the memory function body every memory cell, the photolithography alignment margin and the film etching margin.

Furthermore, since the element structure is simple in that no electrode having the function to assist the write (program) and erase operations is located on the memory function body, the number of fabrication process steps is reduced, and the yield can be improved. Therefore, combination with the transistors that constitute a logic circuit and an analog circuit can be facilitated.

Furthermore, we have found that as a very important design matter, if the requirements (3) and (9) are satisfied and if the requirement (6) is also satisfied, the write (program) and erase operations can be executed at a very low voltage. In concrete, we have ascertained that the write and erase operations can be executed at a low voltage of not higher than 5 V. This operation produces a very large effect in terms of circuit design. There is no need to make a high voltage in a chip dissimilarly from the flash memory, and therefore, a charge pump circuit, which requires an enormous occupation area, can be eliminated or reduced in scale. Particularly, when a small-scale capacity memory for adjustment is built in a logic LSI, the occupation area of the memory section is dominated by the occupation area of the peripheral circuit for driving the memory cells than the memory cells. Therefore, it is most effective to eliminate or reduce the scale of the memory cell voltage booster circuit in order to reduce the chip size.

This is why satisfying the requirements (3), (9) and (6) is particularly preferable.

On the other hand, when the requirement (3) is not satisfied or when electric charges are retained by a conductor in the memory function body, the write (program) operation can be executed even when the requirement (6) is not satisfied, or when the conductor in the memory function body and the diffusion region do not overlap with each other. This is because the conductor in the memory function body executes write assist by capacitive coupling with the gate electrode (write electrode).

Moreover, when the requirement (9) is not satisfied, or when there is an electrode that has the function to assist the write and erase operations on the memory function body, the write operation can be executed even when the requirement (6) is not satisfied, or when the insulator in the memory function body and the diffusion region do not overlap with each other.

In an memory cell array wherein a plurality of memory elements are arrayed, preferably two memory function bodies each consisting of one or more insulation materials may be formed on the opposite sides of a single word line, respectively so that the word line and the memory function body on both sides of the word line are shared by a plurality of memory elements. The definition of the term "single word line" is as described before.

The above arrangement substantially satisfies the requirements (3), (9) and (6). Thus, even in the memory cell array having the memory elements arrayed, the aforementioned effects and advantages are obtained. Further, because only a single word line is selected in rewriting the memory elements on the sides of the single word line, the number of word lines required for the memory operation becomes minimum, so that the memory cell array is integrated at a higher packing density.

By being combined with a logic element, a logic circuit or the like, the semiconductor storage device of the present invention can be effectively widely applied to data processing systems of personal computers, notebook type computers, laptop-type computers, personal assistant/transmitters, mini computers, workstations, mainframes, multi-processor computers or any other types of computers; electronic components that constitute a data processing system, such as CPU's, memories and data storage devices; communication equipment such as telephones, PHS (Personal Handy phone System), modems and routers; image display equipment such as display panels and projectors; business machines such as printers, scanners and copiers; imaging equipment such as video cameras and digital cameras; amusement equipment such as game machines and music players; information equipment of portable information terminals, watches and electronic dictionaries; car equipment such as car navigation systems and car audio devices; AV (Audio Visual) equipment for recording and reproducing information of animations, still pictures and music; electrical appliances such as washing machines, microwave ovens, refrigerators, rice cookers, dish washers, vacuum cleaners and air conditioners; healthcare equipment such as massage machines, scales and sphygmomanometers; and electronic equipment such as portable storage devices of IC cards, memory cards and so on. In particular, the applications to the portable electronic equipment of portable telephones, portable information terminals, IC cards, memory cards, portable computers, portable game machines, digital cameras, portable animation players, portable music players, electronic dictionaries and watches are effective. It is to be noted that the semiconductor storage device of the present invention may be built in electronic equipment as at least part of a control circuit or a data storage circuit, or detachably mounted thereto at need.

To more fully understand the present invention, reference examples will be explained before embodiments of the semiconductor storage device and the portable electronic equipment of the present invention is described in detail below with reference to the drawings.

FIRST REFERENCE EXAMPLE

The semiconductor storage device of the first reference example of the present invention is provided with a memory element 1 that serves as one example of the nonvolatile memory element as shown in FIG. 1. In the memory element 1, a gate electrode 104 is formed on a P-type well region 102 formed via a gate insulation film 103 on the surface of a semiconductor substrate 101.

The upper surface and the side surfaces of the gate electrode 104 are covered with a silicon nitride film 109, which has a trap level for retaining electric charges and serves as a charge retaining film. Portions of the silicon nitride film 109 contacting the side surfaces of the gate electrode 104, that is, the portions of the silicon nitride film 109 located on both side walls of the gate electrode 104 serve as memory function bodies 105a and 105b for actually retaining electric charges. N-type diffusion regions 107a and 107b, which function as a source region and a drain region, respectively, are formed on both sides of the gate electrode 104 and inside the P-type well region 102. The diffusion regions 107a and 107b have an offset structure. That is, the diffusion regions 107a and 107b do not reach the gate electrode beneath region 121. The offset regions 120 and 120, which separate the region 121 from the diffusion regions 107a and 107b, are located below the memory function bodies 105a and 105b. The P-type impurity concentrations of the offset region 120, 120 are effectively lower than the P-type impurity concentration of the gate electrode beneath region 121. A channel region 122 is formed by the gate electrode beneath region 121 and the offset regions 120, 120.

It is to be noted that the memory function bodies 105a and 105b, which substantially retain electric charges, are both sides wall portions of the gate electrode 104. Therefore, the silicon nitride film 109 is required to be formed only on the both sides of the gate electrode 104. That is, no portion of the silicon nitride film 109 above the gate electrode 104 is required.

Moreover, it may be possible to form an insulating film serving as memory function bodies. In this case, the insulating film has a structure in which particles constructed of a nanometer-size conductor or semiconductor are distributed in scattered dots. It is difficult for an electric charge to tunnel its way through the dots since the quantum effect is excessive when the particle 112 has a size smaller than 1 nm, and no remarkable quantum effect appears at the room temperature when the size exceeds 10 nm. Therefore, the diameter of the particle 112 should preferably be within a range of 1 nm to 10 nm.

Furthermore, the silicon nitride films 109, which become charge retaining films, may be formed in a side wall spacer shape on the side surfaces of the gate electrode.

Figure 2:
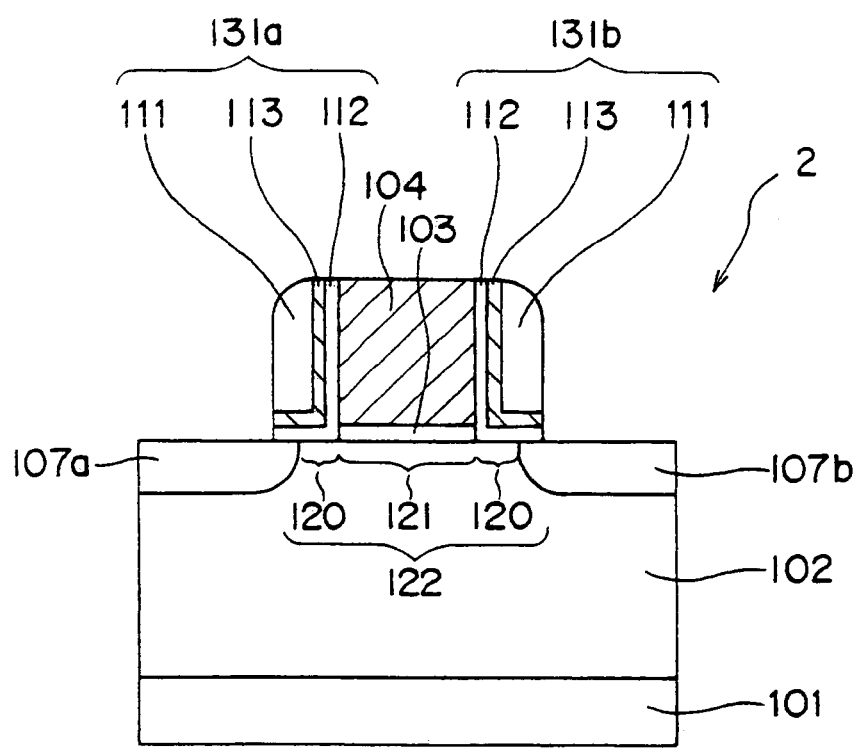
FIG. 2 is a schematic sectional view of a modified example of the memory element.

The semiconductor storage device is provided with the memory element shown in FIG. 2. The memory element 2 is different from the memory element 1 shown in FIG. 1 in that the first memory body 131a and the second memory body 131b respectively have trapping levels retaining electric charges, and in that the silicon nitride film 113 serving as a charge retaining film is interposed between the silicon oxide films 111 and 112 in structure. As shown in FIG. 2, with the structure in which the silicon nitride film 113 is held between the silicon oxide films 113 and 112, charge injection efficiency during the rewrite operation is increased, and higher-speed operation becomes possible.

In FIG. 2, the silicon nitride film 113 may be replaced by a ferroelectric substance.

The principle of write operation of the memory element 2 will be described with reference to FIG. 3 and FIG. 4. In this case, the description is based on the case where the entire bodies of the memory function bodies 131a and 131b have a function to retain electric charges. In addition, the operation principle of the memory element 1 is the same as the stated above, and therefore, the description thereof is omitted.

Herein, the term of "write" means the injection of electrons into the first and second memory function bodies 131a and 131b when the memory element is the N-channel type. Hereinafter, the description is provided on the assumption that the memory element is the N-channel type.

Figure 3:
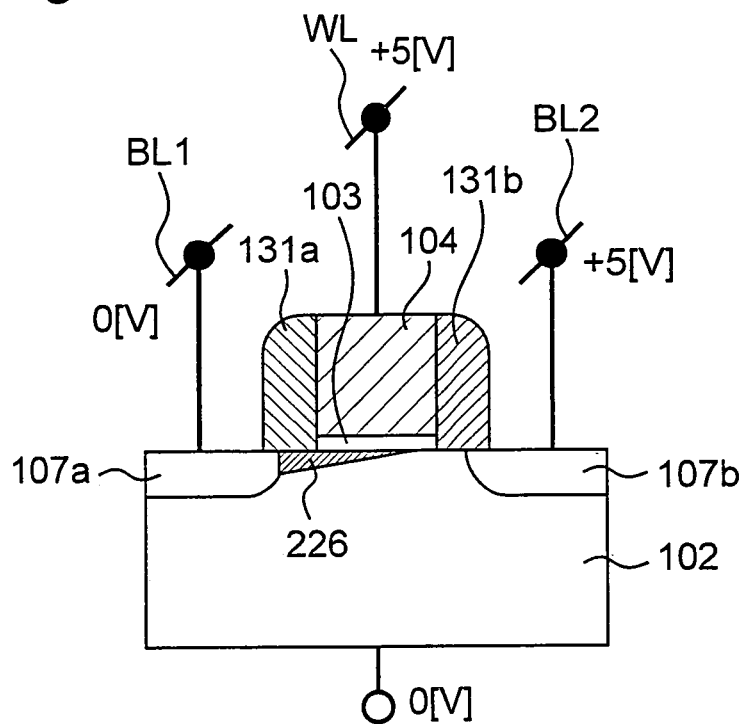
FIG. 3 is a view for explaining a write operation of the modified example of the memory element.

In order to inject an electron (execute write) into the second memory function body 131b, as shown in FIG. 3, the gate electrode 104 is connected with the word line WL, fist and second diffusion regions 107a, 107b are connected with first and second bit lines BL1, BL2. Thereby, the N-type first diffusion region 107a and the N-type second diffusion region 107b are made to serve as a source electrode and a drain electrode, respectively. For example, a voltage of 0 V is applied to the first diffusion region 107a and the P-type well region 102, a voltage of +5 V is applied to the second diffusion region 107b, and a voltage of +5 V is applied to the gate electrode 104. When the above-mentioned voltage is applied, an inversion layer 226 extends from the first diffusion region 107a (source electrode), but it does not reach the second diffusion region 107b (drain electrode), generating a pinch-off point. An electron is accelerated from the pinch-off point to the second diffusion region 107b (drain electrode) by a high electrical field and becomes a so-called hot electron (high energy conduction electron). Write is executed by the injection of this hot electron into the second memory function body 131b. Since no hot electron is generated in the vicinity of the first memory function body 131a, write is not executed.

Figure 4:
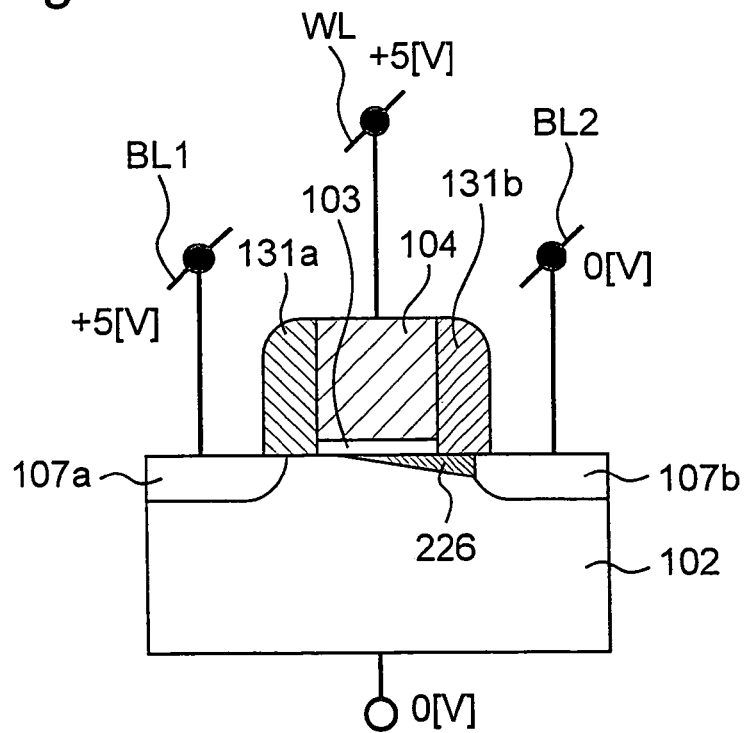
FIG. 4 is a view for explaining the write operation of the modified example of the memory element.

On the other hand, in order to inject an electron (execute write) into the first memory function body 131a, as shown in FIG. 4, the second diffusion region 107b and the first diffusion region 107a are made to serve as the source electrode and the drain electrode, respectively. For example, a voltage of 0 V is applied to the second diffusion region 107b and the P-type well region 102, a voltage of +5 V is applied to the first diffusion region 107a, and a voltage of +5 V is applied to the gate electrode 104. As described above, by exchanging the source and drain regions reversely to the case where an electron is injected into the second memory function body 131b, write can be executed by injecting an electron into the first memory function body 131a.

Next, the principle of erase operation of the memory element 2 will be described with reference to FIG. 5 and FIG. 6.

Figure 5:
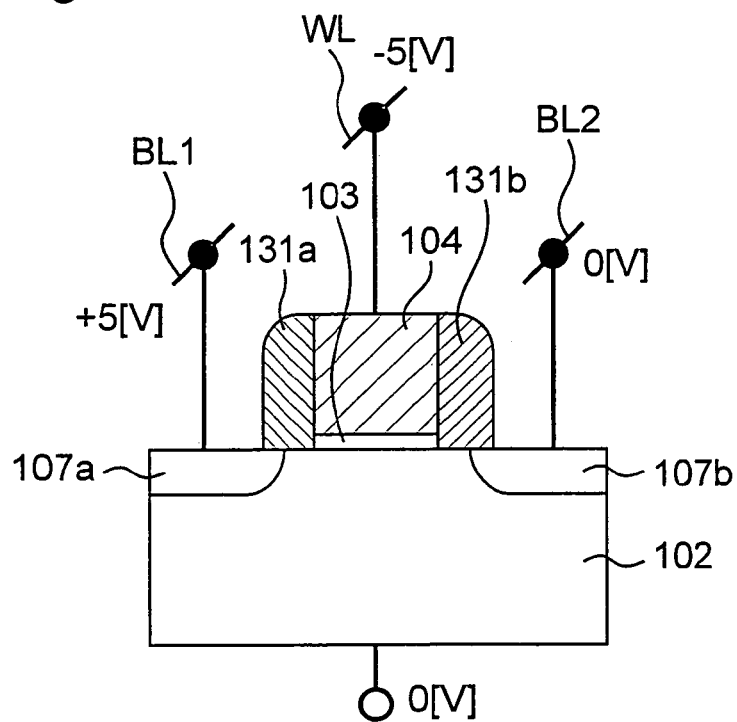
FIG. 5 is a view for explaining an erase operation of the modified example of the memory element.

According to a first method for erasing the information stored in the first memory function body 131a, as shown in FIG. 5, a positive voltage (e.g., +5 V) is applied to the first diffusion region 107a, a voltage of 0 V is applied to the P-type well region 102, a reverse bias is applied to a PN junction of the first diffusion region 107a and the P-type well region 102, and a negative voltage (e.g., −5 V) is further applied to the gate electrode 104. At this time, the potential slope becomes steep, in particular, in the vicinity of the gate electrode 104 at the PN junction due to the influence of the gate electrode to which the negative voltage is applied. Accordingly, a hot hole (high energy hole) is generated on the P-type well region 102 side of the PN junction due to band-to-band tunneling. This hot hole is drawn toward the gate electrode 104 that has a negative potential, and consequently, the hole is injected into the first memory function body 131a. As described above, the erase of the first memory function body 131a is executed. In this case, it is proper to apply a voltage of 0 V to the second diffusion region 107b.

When erasing the information stored in the second memory function body 131b, it is proper to exchange the potential of the first diffusion region with the potential of the second diffusion region in the aforementioned case.

Figure 6:
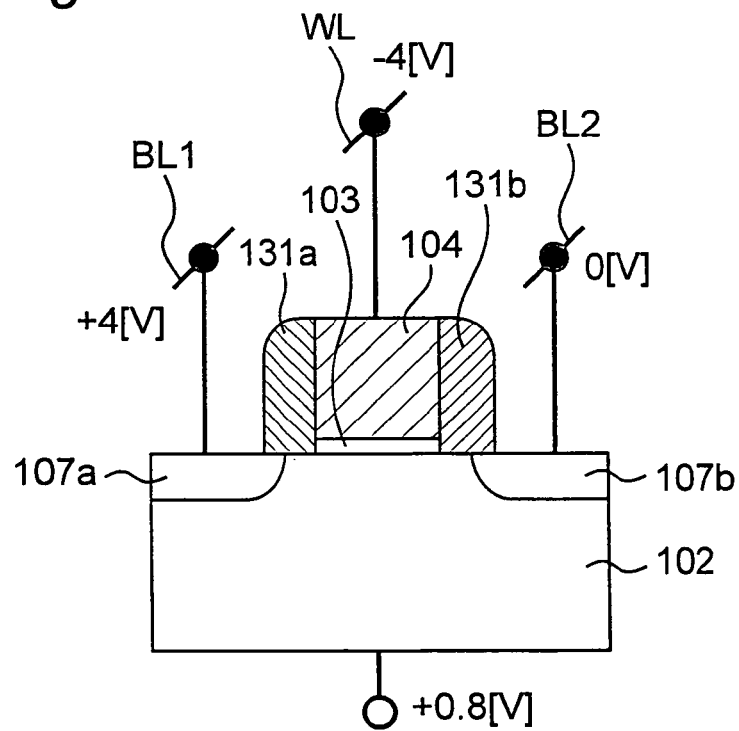
FIG. 6 is a view for explaining the erase operation of the modified example of the memory element.

According to a second method for erasing the information stored in the first memory function body 131a, as shown in FIG. 6, a positive voltage (e.g., +4 V) is applied to the first diffusion region 107a, a voltage of 0 V is applied to the second diffusion region 107b, a negative voltage (e.g., −4 V) is applied to the gate electrode 104, and a positive voltage (e.g., +0.8 V) is applied to the P-type well region 102. In this case, a forward voltage is applied across the P-type well region 102 and the second diffusion region 107b, injecting an electron into the P-type well region 102. The injected electron diffuses to a PN junction of the P-type well region 102 and the first diffusion region 107a and become hot electrons by being accelerated there by an intense electric field. This hot electron generates an electron-hole pair at the PN junction. That is, by applying the forward voltage across the P-type well region 102 and the second diffusion region 107b, the electron injected into the P-type well region 102 becomes a trigger to generate a hot hole at the PN junction located on the opposite side. The hot hole generated at the PN junction is drawn toward the gate electrode 104 that has a negative potential, and consequently, the hole is injected into the first memory function body 131a.

According to the second erase method, even when only a voltage insufficient for the generation of a hot hole by band-to-band tunneling is applied to the PN junction of the P-type well region 102 and the first diffusion region 107a, the electron injected from the second diffusion region 107b becomes a trigger to generate an electron-hole pair at the PN junction, allowing a hot hole to be generated. Therefore, the voltage during the erase operation can be lowered. Particularly, when an offset region 120 (see FIG. 1) exists, the effect that the PN junction becomes steep due to the gate electrode to which the negative potential is applied is a little, and therefore, it is difficult to generate a hot hole by band-to-band tunneling. The second erase method makes up for the defect, and the erase operation can be achieved at a low voltage.

In erasing the information stored in the first memory function body 131a, a voltage of +5 V must to be applied to the first diffusion region 107a according to the first erase method, whereas a voltage of +4 V is only applied to the first diffusion region 107a according to the second erase method. As described above, according to the second erase method, the voltage during erase can be reduced. Therefore, power consumption is reduced, and the deterioration of the memory element due to the hot carrier can be restrained.

Moreover, by either one of the erase methods, overerase does not easily occur in the memory element. The term of "overerase" here is a phenomenon that the threshold value is lowered without saturation as the amount of holes accumulated in the memory function body increases. This is a serious problem in EEPROM (Electrically Erasable Programmable Read-Only Memory) represented by a flash memory, and there occurs a fatal malfunction that memory cell selection becomes impossible particularly when the threshold value becomes negative. On the other hand, in the memory element of the semiconductor storage device of the present invention, only electrons are induced under the memory function bodies even when a large amount of holes are accumulated in the memory function body, and almost no influence is exerted on the potential of the channel region under the gate insulation film. The threshold value during erase is determined by the potential under the gate insulation film, and therefore, overerase does not easily occur.

Figure 7:
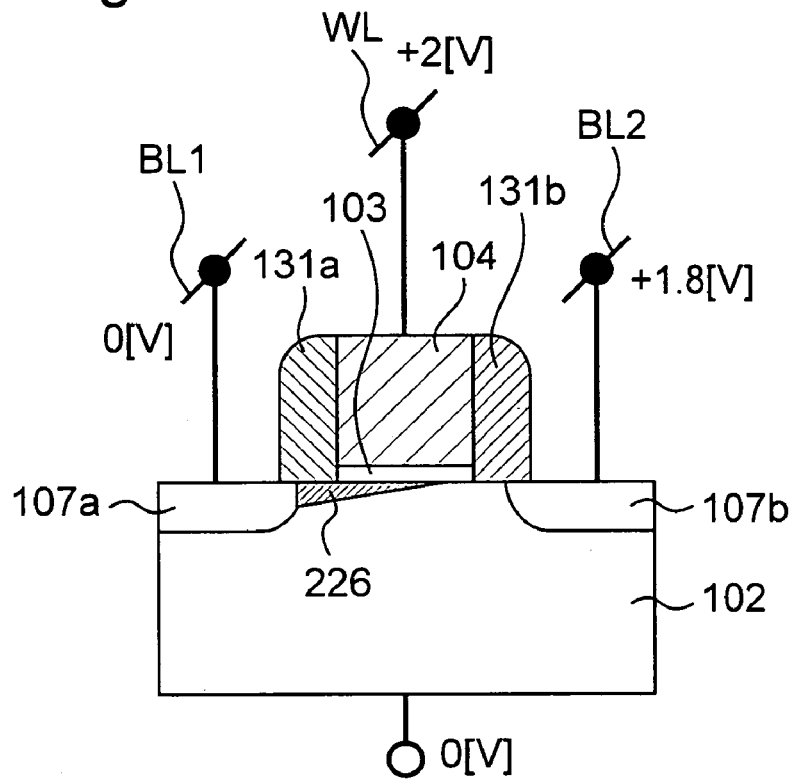
FIG. 7 is a view for explaining a read operation of the modified example of the memory element.

The principle of read operation of the memory element will be further described with reference to FIG. 7.

In reading the information stored in the first memory function body 131a, the memory element 2 is operated as a transistor by making the first diffusion region 107a and the second diffusion region 107b serve as a source electrode and a drain electrode, respectively. For example, a voltage of 0 V is applied to the first diffusion region 107a and the P-type well region 102, a voltage of +1.8 V is applied to the second diffusion region 107b, and a voltage of +2 V is applied to the gate electrode 104. In this case, when no electron is accumulated in the first memory function body 131a, a drain current easily flows. When electrons are accumulated in the first memory function body 131a, the inversion layer is not easily formed in the vicinity of the first memory function body 131a, and therefore, a drain current hardly flows. Therefore, by detecting the drain current, the storage information of the first memory function body 131a can be read. In particular, when read is executed by giving a voltage that causes the pinch-off operation, the state of charges accumulated in the first memory function body 131a can be more accurately determined without being influenced by the presence or absence of charges in the memory function body 131b.

In reading the information stored in the second memory function body 131b, the memory element 2 is operated as a transistor by making the second diffusion region 107b and the first diffusion region 107a serve as the source electrode and the drain electrode, respectively. Although not shown, it is proper to apply, for example, a voltage of 0 V to the second diffusion region 107b and the P-type well region 102, apply a voltage of +1.8 V to the first diffusion region 107a and apply a voltage of +2 V to the gate electrode 104. As described above, by exchanging the source and drain regions reversely to the case where the information stored in the first memory function body 131a is read, the information stored in the second memory function body 131b can be read.

If the channel region 122 that is not covered with the gate electrode 104 is left, that is, if the offset regions 120 exists, then the inversion layer is lost or formed depending on the presence or absence of surplus electric charges of the memory function bodies 131a and 131b in the channel region that is not covered with the gate electrode 104, and consequently, a great hysteresis (a change in the threshold value) is obtained. It is to be noted that the drain current is largely reduced when the width of the offset region 120 is excessively large, and the read speed is significantly slowed. Therefore, it is preferable to determine the width of the offset region 120 so that sufficient hysteresis and read speed can be obtained.

Even when the diffusion regions 107a and 107b reached the ends of the gate electrode 104, i.e., even when the diffusion regions 107a and 107b and the gate electrode 104 overlapped with each other, the threshold value of the transistor was scarcely changed by the write operation. However, a parasitic resistance at the ends of the source and drain is largely changed, and the drain current is largely reduced (by an order of magnitude or more). Therefore, read can be executed by detecting the drain current, and a function as a memory can be obtained. However, when a larger memory hysteresis effect is needed, it is preferred that the diffusion regions 107a and 107b do not overlap with the gate electrode 104. In other words, it is preferred that the offset region 120 exists in the above case.

By the aforementioned operation method, 2-bit write and erase per transistor can be selectively achieved. Moreover, by arranging memory elements 2 with a word line WL connected to the gate electrodes 104 of the memory elements and with a first bit line BL1 and a second bit line BL2 connected to the first diffusion regions 107a and the second diffusion regions 107b, respectively, a memory cell array can be constructed.

Moreover, according to the aforementioned operation method, the 2-bit write and erase per transistor are executed by exchanging the source electrode with the drain electrode. However, the device may be operated as a 1-bit memory by fixing the source electrode and the drain electrode. In this case, it is possible to make one of the source and drain regions have a common fixed voltage, and the number of bit lines connected to the source and drain regions can be reduced by half.

As is apparent from the above description, in the memory element of the semiconductor storage device of the present invention, the memory function bodies are formed independently of the gate insulation film and formed on both sides of the gate electrode, and therefore, the 2-bit operation can be achieved. Moreover, the memory function bodies are separated by the gate electrode, and therefore, interference during rewrite is effectively restrained. Furthermore, the gate insulation film, which is separated from the memory function body, can therefore restrain the short-channel effect by being reduced in film thickness. Therefore, the miniaturization of the memory element and also the semiconductor storage device is facilitated.

In FIGS. 3 to 7, the offset region 120 is not shown.

Moreover, in the drawings, the same reference numerals are given to the portions where the same material and substances are used and do not necessarily indicate the same shapes.

Moreover, it is to be noted that the drawings are schematic, and the dimensional relations between thickness and plane, ratios of thickness and size between layers and portions and so on are different from those of the actual ones. Therefore, the concrete dimensions of thickness and size should be determined in consideration of the following description. Moreover, there are, of course, included the portions whose mutual dimensional relations and ratios are different between the figures.

Moreover, the thickness and the size of the layers and portions described in the present patent specification are the dimensions of the final shapes in the stage in which the formation of the semiconductor device is completed unless specifically described. Therefore, it is to be noted that the dimensions of the final shapes somewhat change depending on the thermal history and so on of the subsequent processes in comparison with the dimensions immediately after the formation of the films, the impurity regions and so on.

SECOND REFERENCE EXAMPLE

Figure 8:
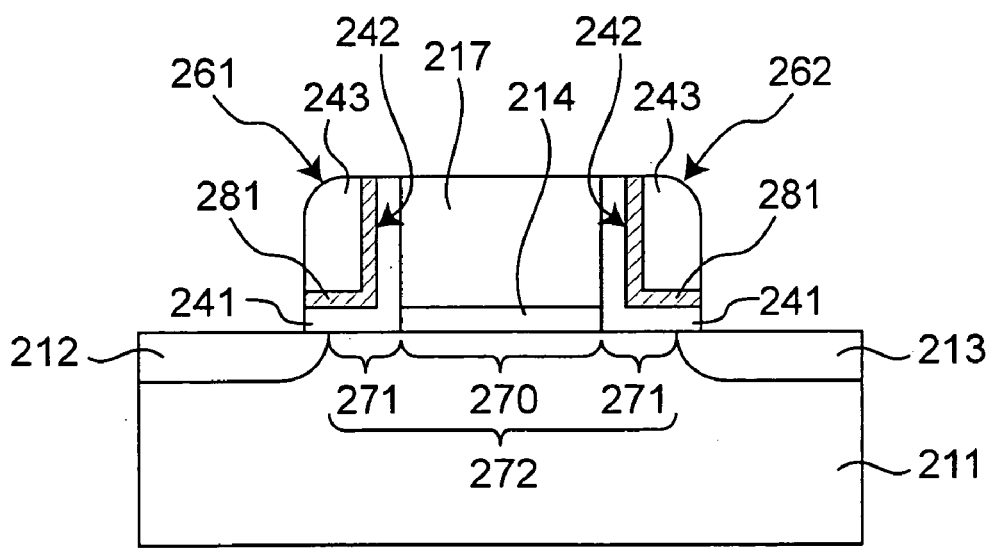
FIG. 8 is a schematic sectional view of a memory element in the semiconductor storage device of a second reference example of the present invention.

As shown in FIG. 8, the memory element in the semiconductor storage device of the second reference example of the present invention has a construction substantially similar to that of the memory element 1 of FIG. 1 except for the memory function bodies 261 and 262 are constructed of a region for retaining electric charges (this may be a region for storing electric charges, or a film having the function to retain electric charges) and a region for restraining the escape of electric charges (this may be a film that has a function to restrain the escape of electric charges).

From the point of view of improving the retention characteristic of the memory, the first and second memory function bodies 261, 262 should preferably include a charge retaining film having the function to retain electric charges and an insulation film. In the memory element, a silicon nitride film 242, which has a level for trapping electric charges, is used as an example of the charge retaining film. Also, silicon oxide films 241, 243, which have a function of preventing the dissipation of electric charges accumulated in the charge retaining film, is used as an example of the insulation film. By including the charge retaining film and the insulation film in the first and second memory function bodies 261, 262, the retention characteristic can be improved by preventing the dissipation of electric charges. Moreover, in the case of including the charge retaining film and the insulation film in the first and second memory function bodies 261, 262, the volume of the charge retaining film can be more moderately reduced in comparison with the case where the first and second memory function bodies 261, 262 are constructed only of the charge retaining film. Thus, the occurrence of a characteristic change due to the movement of electric charges during the retention of the storage can be restrained by limiting the movement of electric charges in the charge retaining film. Furthermore, with the structure in which the silicon nitride film 242 is held between the silicon oxide films 241 and 243, charge injection efficiency during the rewrite operation is increased, and higher-speed operation becomes possible. In this memory element, the silicon nitride film 242 may be replaced by a ferroelectric substance.

Also, the region (silicon nitride film 242) for holding or retaining electric charges in the first and second memory function bodies 261, 262 are overlapped with the first and second diffusion layer regions 212, 213. Herein, the term "overlap" is used to refer to the state that at least part of the region (silicon nitride film 242) for retaining electric charges is present on at least part of the first and second diffusion layer regions 212, 213.

FIG. 8 shows a P-type semiconductor substrate 211, a gate insulating film 214, and an offset region 271, an N-type first diffusion region 212, an N-type second diffusion region 213, a gate electrode beneath region 270, offset regions 271, a channel region 272 and a horizontal region 281 of the silicon nitride film 242. The offset regions 271 are regions offset between a gate region 217 and the first and second diffusion regions 212, 213. The channel region 272 is formed by the gate electrode beneath region 270 and the offset regions 271. The channel region 272 exists between the first diffusion region 212 and the second diffusion region 213. In other words, the first diffusion region 212 is formed on one side of the channel region, and the second diffusion region 213 is formed on the other side of the channel region. The first and second memory function bodies 261, 262 store information in the horizontal region 281 of the silicon nitride film 242. The horizontal region 281 is a region extending in parallel with the surface of the semiconductor substrate 211

An effect produced by the arrangement that the silicon nitride film 242 serving as the region for retaining electric charges in the first and second memory function bodies 261 and 262 overlap with the first and second diffusion regions 212 and 213 will be described.

Figure 9:
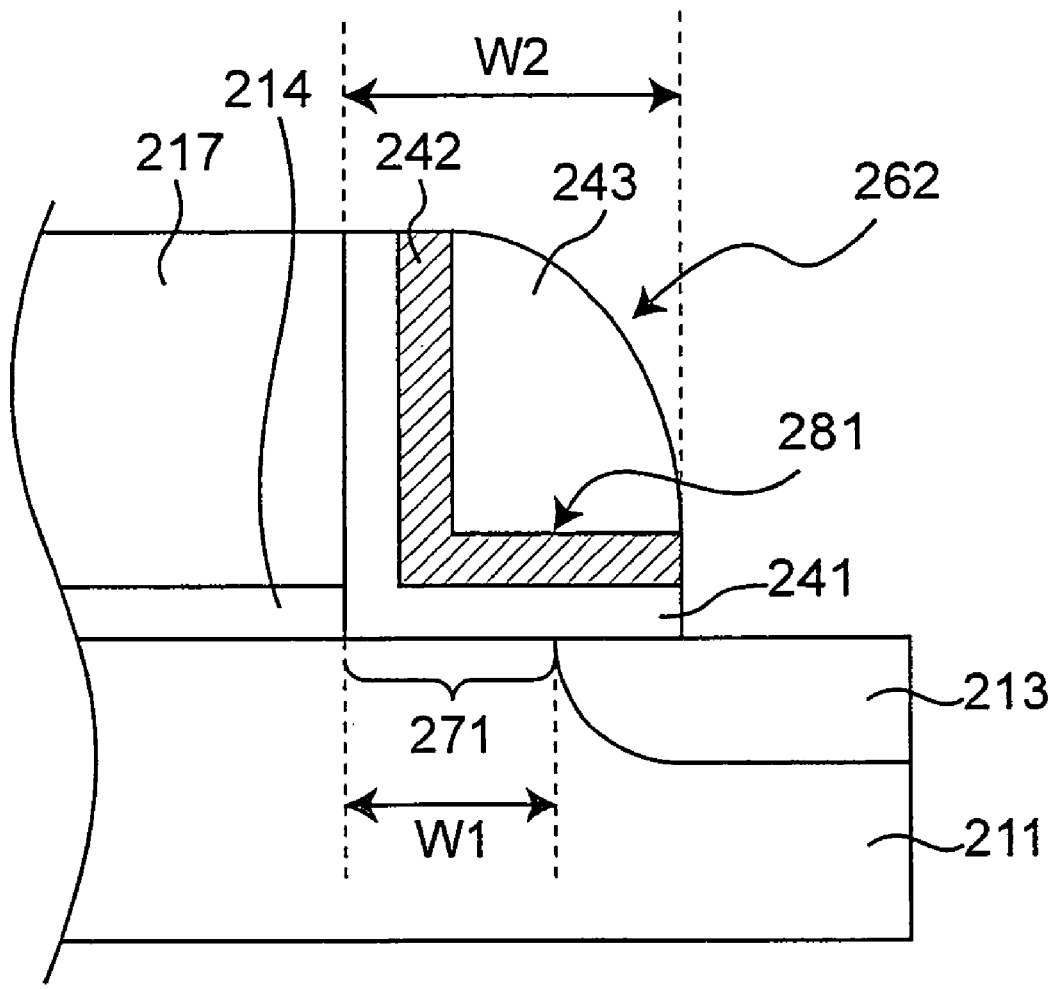
FIG. 9 is an enlarged schematic sectional view of the memory element in the semiconductor storage device of the second reference example.

As shown in FIG. 9, assuming that the amount of offset of a gate electrode 217 with respect to the second diffusion region 213 is W1 and that the width of the second memory function body 262 in a cross-sectional plane in the channel-length direction of the gate electrode 217 (i.e. in the horizontal direction of the figure) is W2 in the peripheral portions of the second memory function body 262, then the amount of overlap of the second memory function body 262 with the diffusion region 213 is expressed by W2−W1. What is important here is that the second memory function body 262 constructed of the silicon nitride film 242 in the second memory function body 262 overlaps with the second diffusion region 213, i.e., the relation of W2>W1 is satisfied.

In FIG. 9, the end of the silicon nitride film 242 remote from the gate electrode 217 coincides with the end of the second memory function body 262 remote from the gate electrode 217, and therefore, the width of the second memory function body 262 is defined as W2.

Figure 10:
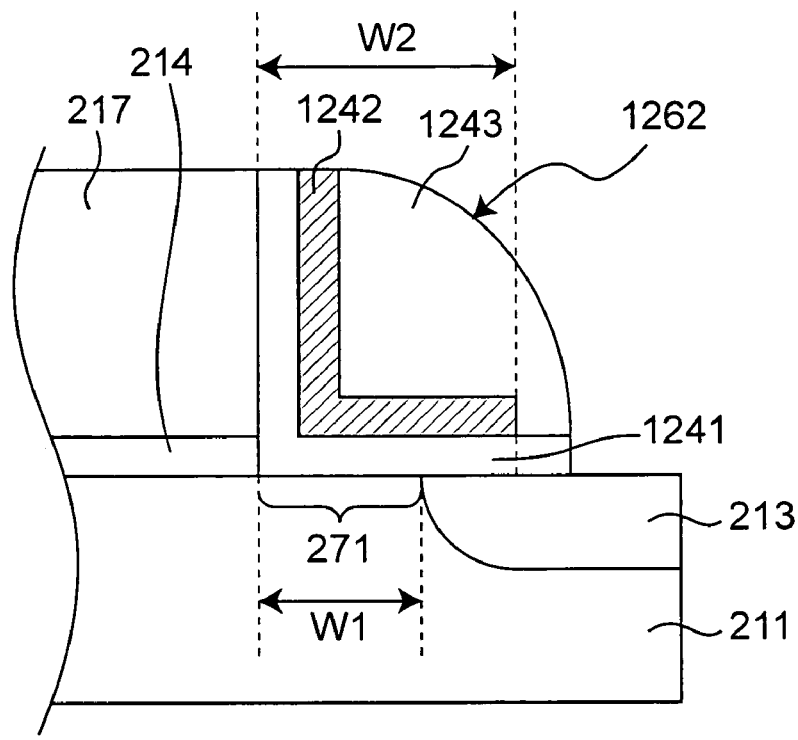
FIG. 10 is an enlarged schematic sectional view of a modified example of the memory element in the semiconductor storage device of the second reference example.

When the second memory function body 1262 is constructed of the silicon nitride film 1242 and the silicon oxide films 1241, 1243 as shown in FIG. 10, the end of the second memory function body 1262 does not coincide with the end of the silicon nitride film 1242 on the opposite side of the gate electrode 217. In other words, the end of the second memory function body 1262 does not coincide with the end of the silicon nitride film 1242 on the right side of the figure. In this case, there is defined as W2 the distance from the end of the second memory function body 1262 on the side of the gate electrode 217 to the end of the silicon nitride film 1242 on the opposite side of the gate electrode 217.

Figure 11:
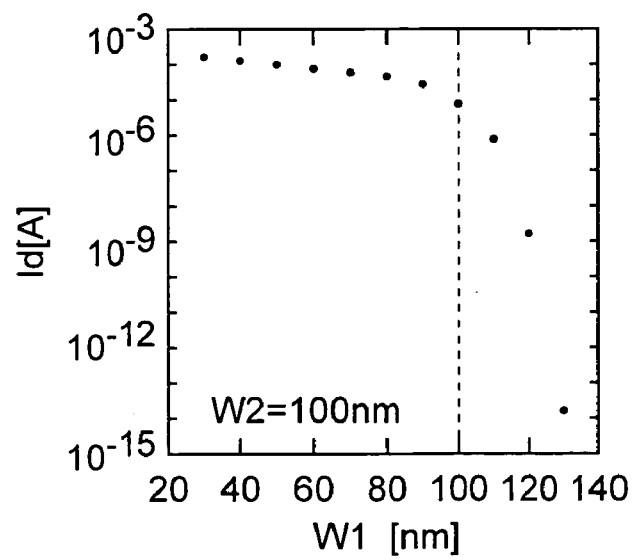
FIG. 11 is a graph showing the electrical characteristic of the memory element in the semiconductor storage device of the second reference example.

FIG. 11 shows a drain current Id in the structure of the memory element shown in FIG. 9 when W1 is varied with the width W2 fixed to 100 nm. Herein, the drain current Id is obtained by device simulation performed under the conditions that the second memory function body 262 is in erase state (positive holes are stored), and the first and second diffusion layer regions 212, 213 are set to be a source electrode region and a drain electrode region, respectively.

As shown in FIG. 11, with W1 being 100 nm or more (i.e., when the silicon nitride film 242 and the diffusion layer region 213 are not overlapped), the drain current Id shows rapid reduction. Since a drain current value is almost in proportion to a read operation speed, memory performance is rapidly deteriorated when W1 is set at 100 nm or more. In the range where the silicon nitride film 242 and the diffusion layer region 213 are overlapped, the drain current shows mild reduction. Therefore, taking a manufacturing dispersion into consideration, it is difficult to obtain a memory function unless at least part of the silicon nitride film 242 that is a film having a function of holing electric charges is overlapped with the source/drain region (the first and second diffusion regions 211, 213).

Based on the above-described result of the device simulation, a memory cell array is manufactured with W2 being fixed to 100 nm, and W1 being set to 60 nm and 100 nm as design values. When W1 is 60 nm, the silicon nitride film 242 is overlapped with the first and second diffusion layer regions 212, 213 by 40 nm as a design value, and when W1 is 100 nm, there is no overlap as a design value. As a result of measuring read time of these memory cell arrays in is comparison with the worst cases in consideration to dispersion, it was found out that the case where W1 was 60 nm as a design value was 100 times faster in readout access time. From a practical standpoint, it is preferable that the read access time is 100 nanoseconds or less per bit. It was found out, however, that this condition was never satisfied in the case of W1=W2. It was also found out that W2−W1>10 nm was more preferable in consideration to manufacturing dispersion.

As shown in FIG. 9, it is preferable for reading information stored in the horizontal region 281 of the first memory function body 261 to set the first diffusion layer region 212 as a source electrode and the second diffusion layer region 213 as a drain region similar to the first reference example and to form a pinchoff point on the side closer to the drain region in the channel region 272. Specifically, in reading information stored in either one of the first and second memory function bodies 261, 262, the pinch-off point is preferably formed in a region closer to the other of the first and second memory function bodies 261, 262 in the channel region 272. This makes it possible to detect memory information in one of the first and second memory function bodies 261, 262 with good sensitivity regardless of the storage condition of the other of the first and second memory function bodies 261, 262. Thus, when reading information stored in either one of the first and second memory function bodies 261, 262, it results in large contribution to implementation of two-bit operation to form the pinch-off point in a region closer to the other of the first and second memory function bodies 261, 262 in the channel region 272.

The pinch-off point is not necessarily formed in read operation in the case of storing information only in one of the first and second memory function bodies 261, 262, or in the case of using the first and second memory function bodies 261, 262 in the same storing condition.

Although not shown in FIG. 8, a well region (P-type well in the case of N-channel device) is preferably formed on the surface of the semiconductor substrate 211. Forming the well region facilitates control of other electric characteristics (withstand voltage, junction capacitance, and short channel effect) while maintaining impurity concentration of the channel region optimum for memory operation (rewrite operation and read operation).

Figure 12:
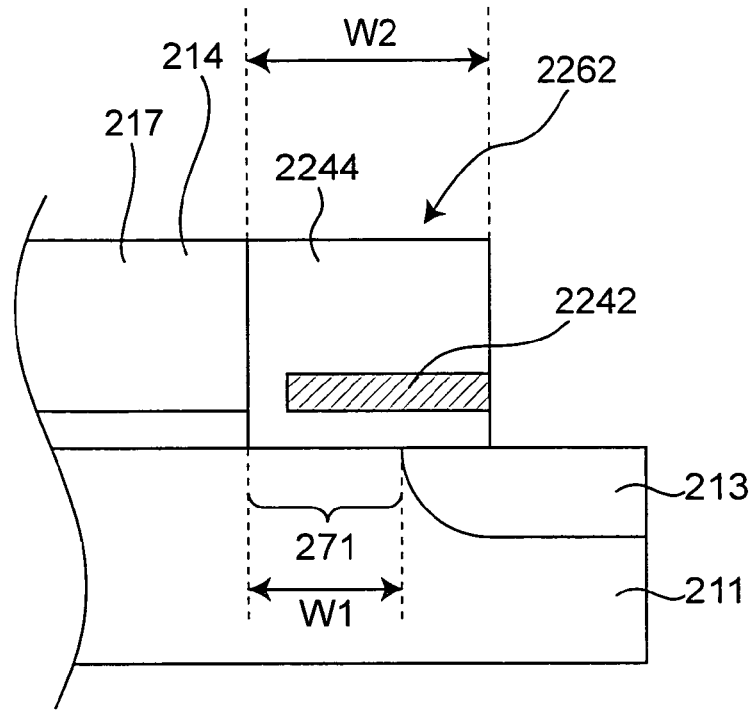
FIG. 12 is a schematic sectional view of a modified example of the memory element in the semiconductor storage device of the second reference example.

Also, it is preferable that the memory function body contains a charge retaining film disposed approximately parallel to the surface of the gate insulating film. In other words, it is preferable that the surface of the charge retaining film in the memory function body is disposed so as to have a constant distance from the surface of the gate insulating film. Particularly, as shown in FIG. 12, a silicon nitride film 242b as an electric charge retention film in the memory function body 262 has a face approximately parallel to the surface of the gate insulating film 214. In other words, the entire silicon nitride film 242b is preferably uniform in height with reference to the surface of the gate insulating film 214.

The presence of the silicon nitride film 2242 approximately parallel to the surface of the gate insulating film 214 in the second memory function body 2262 makes it possible to effectively control easiness of formation of an inversion layer in the offset region 271 with use of an amount of electric charges stored in the charge retention film 2242 thereby enabling increase of memory effect. Also, by placing the silicon nitride film 2242 approximately parallel to the surface of the gate insulating film 214, change of memory effect may be kept relatively small even with a dispersed offset amount (W1), enabling restraint of memory effect dispersion. In addition, movement of electric charges toward upper side of the silicon nitride film 2242 may be suppressed, and therefore characteristic change due to the movement of electric charges during memory holding may be restrained.

Furthermore, the second memory function body 2262 preferably contains an insulating film (e.g., a portion of the silicon oxide film 244 on the offset region 271) that separates the silicon nitride film 2242 approximately parallel to the surface of the gate insulating film 214 from the channel region (or the well region). This insulating film may restrain dissipation of the electric charges stored in the charge retention film, thereby contributing to obtaining a memory element with better holding characteristics.

It is noted that controlling the film thickness of the silicon nitride film 2242 as well as controlling the film thickness of the insulating film under the silicon nitride film 2242 (a portion of the silicon oxide film 2244 on the offset region 271) to be constant make it possible to keep the distance from the surface of the semiconductor substrate 211 to the electric charges stored in the charge retention film approximately constant. More particularly, the distance from the surface of the semiconductor substrate to the electric charges stored in the charge retention film may be controlled to be within the range from a minimum film thickness value of the insulating film under the silicon nitride 2242 to the sum of a maximum film thickness of the insulating film under the silicon nitride film 2242 and a maximum film thickness of the silicon nitride film 2242. Consequently, the concentration of electric line of force generated by the electric charges stored in the silicon nitride film 2242 may be roughly controlled, and therefore dispersion of the degree of memory effect of the memory element may be minimized.

The horizontal region 281 of the first or second memory function bodies 261, 262 may be formed like the silicon nitride film 2242.

Figure 13:
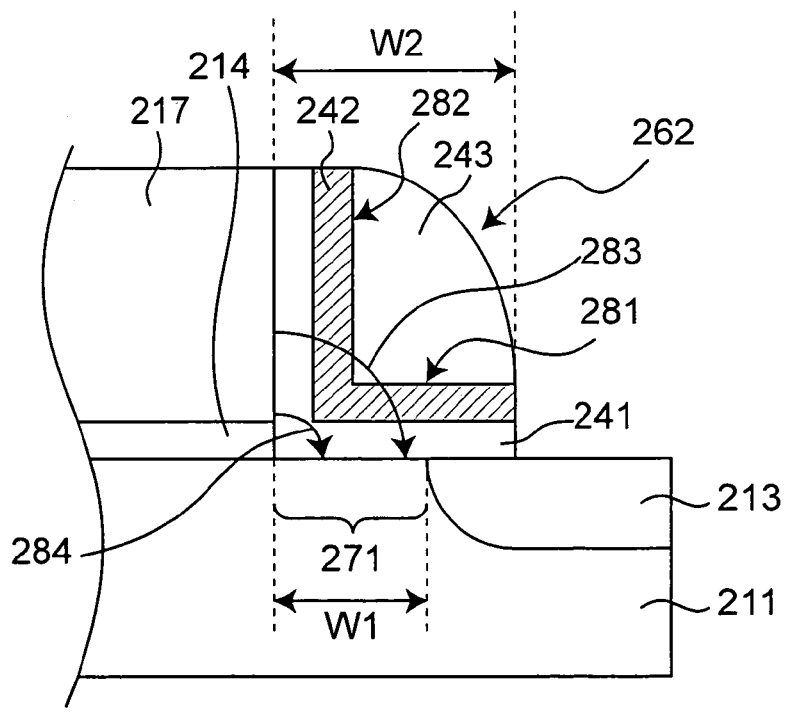
FIG. 13 is a schematic sectional view of a memory element in the semiconductor storage device of a third reference example of the present invention.

In the memory function body 262 of the semiconductor storage device according to the third reference example of the present invention, the silicon nitride film 242 for holding electric charges has an approximately uniform film thickness as shown in FIG. 13. Also, the memory function body 262 has the horizontal region 281 disposed approximately parallel to the surface of the gate insulating film 214 and the vertical region 282 disposed in approximately parallel to the side surface of the gate electrode 217.

When a positive voltage is applied to the gate electrode 217, electric line of force in the memory function body 262 passes the silicon nitride film 242 total two times as shown with an arrow 283. Specifically, the electric line of force passes the horizontal region 281 of the silicon nitride film 242 after passing the vertical region 282 of the silicon nitride film 242. It is noted that when a negative voltage is applied to the gate electrode 217, the direction of electric line of force is reversed (opposite direction of the arrow 283). Herein, a dielectric constant of the silicon nitride film 242 is approx. 6, while a dielectric constant of silicon oxide films 241, 243 is approx. 4. Eventually, an effective dielectric constant of the memory function body 262 in the direction of electric line of force (arrow 283), where the charge retention film includes the vertical portion 282 and the horizontal portion 281, becomes larger than that in the case where the charge retention film includes only the first portion 281, which makes it possible to decrease potential difference between the both edges of the electric line of force. Specifically, much part of the voltage applied to the gate electrode 217 is used to reinforce electric fields in the offset region 271.

Electric charges are injected into the silicon nitride film 242 in rewrite operation because generated electric charges are pulled by electric fields in the offset region 271. As a consequence, the silicon nitride film 242 including the second portion 282 increases the electric charges injected into the memory function body 262 in rewrite operation, thereby increasing a rewrite speed.

In the case where the portion of the silicon oxide film 243 is a silicon nitride film, specifically, in the case where the charge retention film is not flat against the height corresponding to the surface of the gate insulating film 214, movement of electric charges toward upper side of the silicon nitride film becomes outstanding, and holding characteristics are deteriorated.

Instead of silicon nitride film, the charge retention film is more preferably formed from high-dielectric substances such as hafnium oxide having extremely large dielectric constant.

Further, the memory function body more preferably includes an insulating film (a portion of the s241 on the silicon oxide film on the offset region 271) that separates the charge retention film approximately parallel to the surface of the gate insulating film from the channel region (or the well region). This insulating film may restrain dissipation of the electric charges stored in the charge retention film, thereby enabling further improvement of holding characteristics.

Also, the memory function body more preferably includes an insulating film (a portion of the silicon oxide film 241 in contact with the gate electrode 217) that separates the gate electrode from the charge retention film extending in the direction approximately parallel to the side face of the gate electrode. This insulating film may prevent injection of electric charges from the gate electrode into the charge retention film and prevent change of electric characteristics, which may increase reliability of the memory element.

Further, similar to the second reference example, it is preferable that the film thickness of the insulating film under the silicon nitride film 242 (a portion of the silicon oxide film 241 on the offset region 271) is controlled to be constant, and further the film thickness of the insulating film disposed on the side face of the gate electrode (a portion of the silicon oxide film 241 in contact with the gate electrode 217) is controlled to be constant. Consequently, the concentration of electric line of force generated by the electric charges stored in the silicon nitride film 242 may be roughly controlled, and leakage of electric charges may be prevented.

FOURTH REFERENCE EXAMPLE

In the forth reference example, optimization of the distance between a gate electrode, a memory function body, and a source/drain region is explained.

Figure 14:
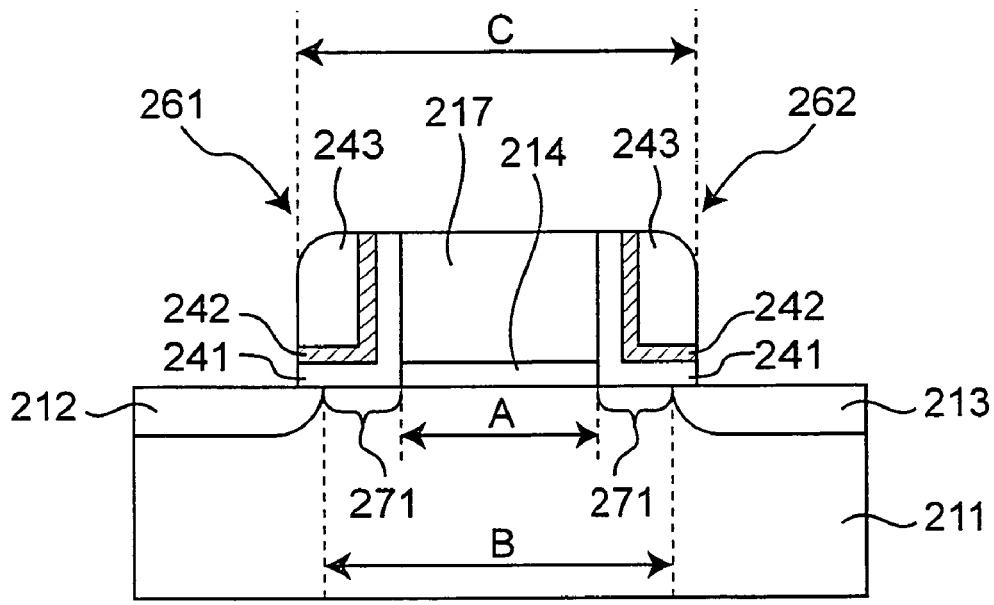
FIG. 14 is a schematic sectional view of a memory element in the semiconductor storage device of a fourth reference example of the present invention.

As shown in FIG. 14, reference symbol A denotes a gate electrode length in the cross section in channel length direction, reference symbol B denotes a distance (channel length) between source and drain regions, and reference symbol C denotes a distance from the edge of one memory function body to the edge of the other memory function body, specifically a distance from the edge of a film (the side away from the gate electrode) having a function of holding the electric charges in one charge holding portion in the cross section in channel length direction to the edge of a film 242 (the side away from the gate electrode 217) having a function of holding the electric charges in the other memory function body 262.

A relationship of A<C is preferable. When this relationship is satisfied, in the channel region, there is present an offset region 271 between a portion under the gate electrode 217 and the first and second diffusion regions 212, 213. Thereby, the electric charges stored in the silicon nitride film 242 of the first and second memory function bodies 261, 262 (silicon nitride film 242) effectively change easiness of inversion in the entire part of the offset region 271. As a result, memory effect is increased, and high-speed read operation is particularly enabled.

Also, when the gate electrode 217 and the first and second diffusion regions 212, 213 are offset, that is, when the relationship of A<B is satisfied, easiness of inversion of the offset region when a voltage is applied to the gate electrode 217 is largely changed by an electric charge amount stored in the memory function bodies 261, 262. Consequently, memory effect increases and short channel effect can be reduced.

However, as long as the memory effect is effective, the offset region is not necessarily required. Even when the offset region 271 is not present, if the impurity concentration in the first and second diffusion regions 212, 213 is sufficiently small, the memory effect can still be effective in the silicon nitride film 242 of the first and second memory function bodies 261, 262.

While, as described referring to FIG. 11, a memory function can not be obtained unless at least part of the silicon nitride film 242 is overlapped with the source/drain region (the first and second diffusion regions 212, 213). Consequently, a relationship of B<C is preferably satisfied.

Therefore, the state of A<B<C is most preferable.

The memory element shown in FIG. 14 has essentially the same structure as that of the memory element of the second reference example.

FIFTH REFERENCE EXAMPLE

Figure 15:
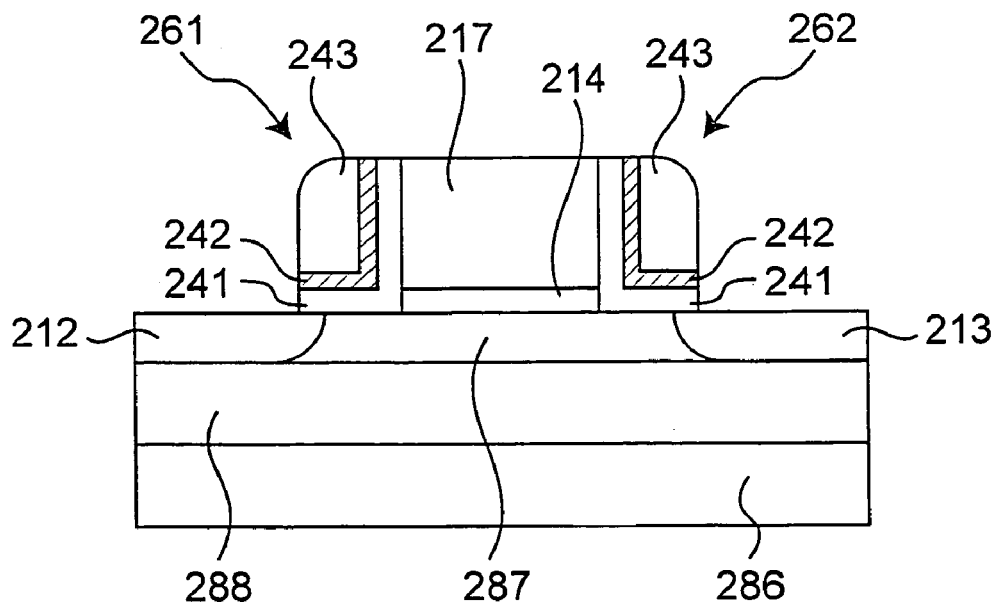
FIG. 15 is a schematic sectional view of a memory element in the semiconductor storage device of a fifth reference example of the present invention.

A memory element of semiconductor storage device according to the fifth reference example of the present invention has essentially the same structure as that in the second reference example except that the semiconductor substrate is SOI substrate, as shown in FIG. 15.

The memory element is structured such that an embedded oxide film 288 is formed on a semiconductor substrate 286, and on top of the embedded oxide film 288, SOI layer is further formed. In the SOI layer, there are formed the first and second diffusion regions 212, 213, and other areas constitute a body region 287.

This memory element also brings about the functions and effects similar to those of the memory element in the second reference example. Further, since the junction capacitance between the first and second diffusion regions 212, 213 and the body region 287 may be considerably reduced, it becomes possible to increase a device speed and to decrease power consumption.

SIXTH REFERENCE EXAMPLE

Figure 16:
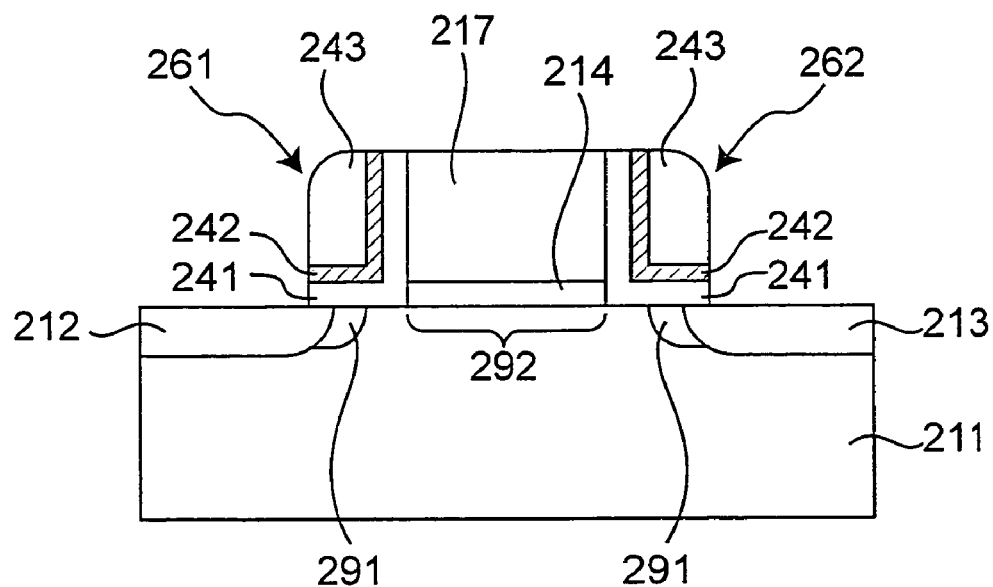
FIG. 16 is a schematic sectional view of a memory element in the semiconductor storage device of a sixth reference example of the present invention.

A memory element in the sixth reference example of the present invention has essentially the same structure as that in the second reference example except that in the vicinity of the channel side of the N-type first and second diffusion regions 212, 213, a P-type highly-concentrated region 291 is added, as shown in FIG. 16.

Specifically, the concentration of P-type impurity (e.g., boron) in the P-type highly-concentrated region 291 is higher than the concentration of P-type impurity in the gate electrode beneath region 292. An appropriate value of the P-type impurity concentration in the P-type highly-concentrated region 291 is, for example, around $5\times10^{17}$ to $1\times10^{19}$ cm$^{-3}$. Also, a value of the P-type impurity concentration in the region 292 may be set to, for example, $5\times10^{16}$ to $1\times10^{18}$ cm$^{-3}$.

Thus, providing the P-type highly-concentrated region 291 makes the junction between the first and second diffusion regions 212, 213 and the semiconductor substrate 211 steep right under the first and second memory function bodies 261, 262. This facilitates generation of hot carriers in write and erase operation, thereby enabling reduction of voltage in write operation and erase operation or implementing high-speed write operation and erase operation. Further, since the impurity concentration in the gate electrode beneath region 292 is relatively small, a threshold value when the memory is in erased state is small and so the drain current becomes large. Consequently, a read speed is increased. This makes it possible to provide a memory element having low rewrite voltage or a high rewrite speed, and having a high read speed.

Also in FIG. 16, by providing the P-type highly-concentrated region 291 in a position adjacent to the source/drain regions (the first and second diffusion regions 212, 213) and on the lower side of the first and second memory function bodies 261, 262 (that is a position not right under the gate electrode), a threshold value of the entire transistor shows considerable increase. The degree of this increase is extremely larger than that in the case where the P-type highly-concentrated region 291 is right under the gate electrode. When write electric charges (electrons in the case where the transistor is N channel type) are stored in the first and second memory function bodies 261, 262, the difference becomes larger. When enough erase electric charges (positive holes in the case where the memory element is N channel type) are stored in the memory function body, a threshold value of the entire transistor is decreased down to a value determined by the impurity concentration in the channel region (gate electrode beneath region 292) under the gate electrode 217. Specifically, the threshold value in the erased state is not dependent on the impurity concentration in the P-type highly-concentrated region 291, whereas the threshold value in the written state receives extremely large influence. Therefore, disposing the P-type highly-concentrated region 291 under the memory function bodies and adjacent to the source/drain regions (the first and second diffusion regions 212, 213) imparts extremely large fluctuation only to the threshold value in the written state, thereby enabling remarkable increase of memory effect (difference of threshold values in the erased state and the written state).

SEVENTH REFERENCE EXAMPLE

Figure 17:
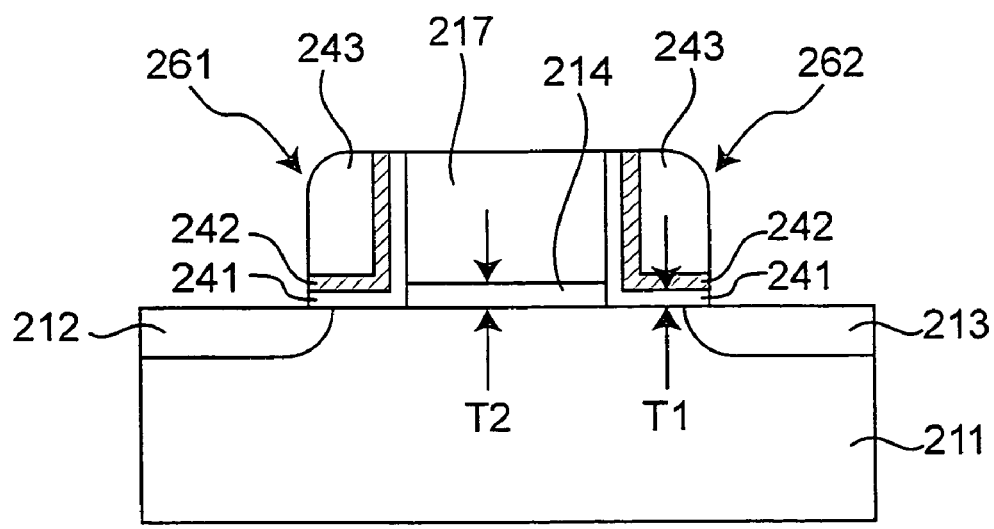
FIG. 17 is a schematic sectional view of a memory element in the semiconductor storage device of a seventh reference example of the present invention.

A memory function body of a semiconductor storage device in the seventh reference example of the present invention has essentially the same structure as that in the second reference except that the thickness T1 of the insulating film 241 (contacting portion of the silicon oxide film 241 to the semiconductor substrate 211) which separates the silicon nitride film 242, as an example of charge retention film, from the channel region or the well region 211 of P-type semiconductor substrate is smaller than the thickness T2 of the gate insulating film 214, as shown in FIG. 17.

The gate insulating film 214 has a lower limit of the thickness T2 because of the request for withstand voltage in memory rewrite operation. However, the thickness T1 of the insulating film 241 can be smaller than T2 regardless of the request for withstand voltage.

In the memory element of the present reference example, the thickness T1 of the insulating film has high design freedom as stated above because of the following reason.

In the memory element, the insulating film that separates the charge retention film from the channel region or the well region of the semiconductor substrate 211 is not interposed in between the gate electrode 217 and the channel region or the well region. Consequently, the insulating film that separates the charge retention film from the channel region or the well region of the semiconductor substrate 211 does not receive direct influence from the high-electric fields that affect in between the gate electrode 217 and the channel region or the well region, but receives influence from relatively weak electric fields expanding from the gate electrode 217 in lateral direction. As a result, despite the request for withstand voltage to the gate insulating film (contacting portion of the silicon oxide film 241 to the semiconductor substrate 211), it becomes possible to make T1 smaller than T2. Decreasing the thickness T1 of the insulating film makes it possible to facilitate injection of electric charges into the first and second memory function bodies 261, 262, to decrease voltage for write operation and erase operation, and/or to conduct high-speed write operation and erase operation. In addition, since an electric charge amount induced in the channel region or the well region increases when electric charges are stored in the silicon nitride film 242, increased memory effect may be implemented.

Some electric lines of force having short length in the memory function body do not pass the silicon nitride film 242 as shown with an arrow 284 in FIG. 13. Since electric field strength is relatively large on such a short electric line of force, the electric fields along the electric line of force plays an important role in rewrite operation. By decreasing the thickness T1 of the insulating film 241, the silicon nitride film 242 moves to the lower side of the FIG. 13, so that the electric line of force shown with the arrow 284 passes the silicon nitride film 242. As a consequence, an effective dielectric constant in the memory function body along the electric line of force 284 in the direction of arrow 284 becomes large, which makes it possible to make potential difference between the both ends of the electric line of force 284 smaller. Therefore, most part of voltage applied to the gate electrode 217 is used to strengthen the electric fields in the offset region, thereby implementing high-speed write operation and erase operation. In addition, though the description thereof is omitted, the electric line of force of in the first memory function body 261 is in the same state as that in FIG. 13

Contrary to this, for example in EEPROM as typified by flash memory, an insulating film that separates a floating gate from the channel region or the well region is interposed in between a gate electrode (control gate) and the channel region or the well region, so that the insulating film receives direct influence from high electric fields of the gate electrode. In EEPROM, therefore, the thickness of the insulating film that separates the floating gate from the channel region or the well region is limited, which hinders optimization of the functions of a memory element.

As is clear from the above, by setting the thickness T1 of the insulating film 241 and the thickness T2 of the gate insulating film 214 as T1<T2, it becomes possible to decrease voltage in write operation and erase operation or implement high-speed write operation and erase operation, and to enable further increase of memory effect without degrading withstand voltage capability of the memory. It is noted that the thickness T1 of the insulating film is preferably 0.8 nm or more, that is the limit range in which uniformity in manufacturing process or certain level of film quality may be maintained and holding characteristics do not suffer extreme deterioration.

Specifically, in the case of liquid crystal driver LSI which has a severe design rule and requires high withstand voltage, maximum 15 to 18V voltage is necessary for driving liquid crystal panel TFT (Thin Film Transistor) Eventually, it is not possible to make the gate oxide film 214 thinner. In the case of mounting a nonvolatile memory of the present invention as an image adjuster together with other devices on the liquid crystal driver LSI, the memory element of the present invention enables optimum design of the thickness of the insulating film that separates the charge retention film (silicon nitride film 242) from the channel region or the well region independently of the thickness of the gate insulating film. For example, in a memory cell with a gate electrode length (word line width) of 250 nm, there may be separately set like T1=20 nm and T2=10 nm, fulfilling a memory cell with good write efficiency.

Short channel effect is not generated even though T1 is larger than that of normal logic transistors. This is because the source/drain regions (first and second diffusion regions 212, 213) are offset from the gate electrode.

EIGHTH REFERENCE EXAMPLE

Figure 18:
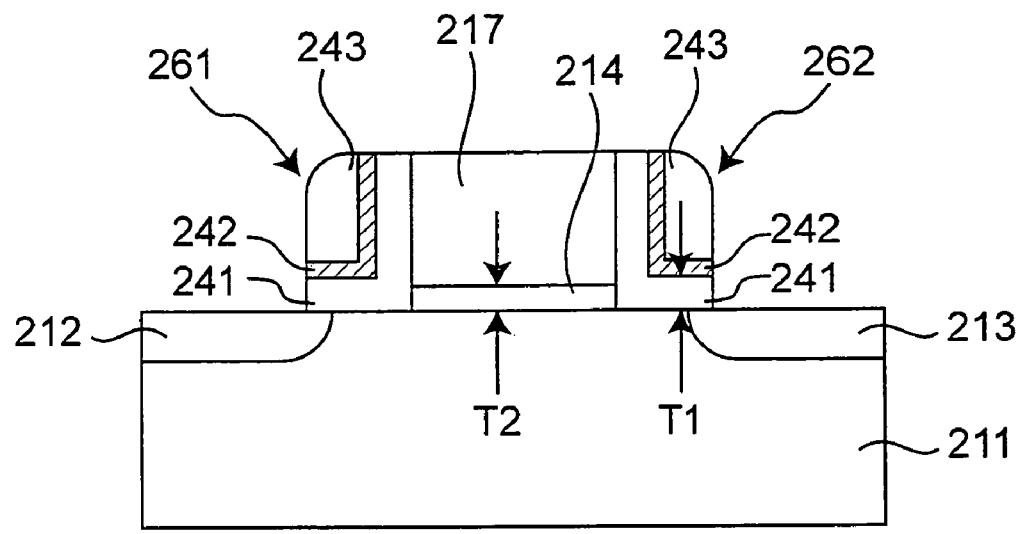
FIG. 18 is a schematic sectional view of a memory element in the semiconductor storage device of an eighth reference example of the present invention.

A memory element of a semiconductor storage device according to the eighth reference example of the present invention has essentially the same structure as that in the second reference example except that the thickness T1 of the insulating film (contacting portion of the silicon oxide film 241 to the semiconductor substrate 211) which separates the silicon nitride film 242, as an example of charge retention film, from the channel region or the well region of P-type semiconductor substrate is larger than the thickness T2 of the gate insulating film 214, as shown in FIG. 18.

The gate insulating film 214 has an upper limit of the thickness T2 because of the request for prevention of short channel effect of the device. However, the thickness T1 of the insulating film 241 can be larger than T2 regardless of the request for prevention of short channel effect. Specifically, as miniaturization scaling proceeds (thinning of the gate insulating film proceeds), the thickness T1 of the insulating film that separates the silicon nitride film 242 from the channel region or the well region may be optimally designed independently of the thickness T2 of the gate insulating film, which implements the effect that the first and second memory function bodies 261, 262 will not disturb scaling.

In the memory element of the present reference example, the thickness T1 of the insulating film has high design freedom as stated above because, as is already described, the insulating film, which separates the silicon nitride film 242 from the channel region or the well region of the P-type semiconductor substrate 211, is not interposed in between the gate electrode and the channel region or the well region. As a result, despite the request for prevention of short channel effect to the gate insulating film 214, it becomes possible to make the thickness T1 larger than the thickness T2.

Increasing the thickness T1 makes it possible to prevent dissipation of the electric charges stored in the first and second memory function bodies 261, 262 and to improve holing characteristics of the memory.

Therefore, setting as T1>T2 enables improvement of holding characteristics without deteriorating short channel effect of the memory.

It is noted that the thickness T1 of the insulating film is preferably 20 nm or less in consideration of reduction of a rewrite speed.

The conventional nonvolatile memory as typified by flash memory is structured such that a selection gate electrode constitutes a write/erase gate electrode, and a gate insulating film (including a floating gate) corresponding to the write/erase gate electrode serves also as an electric charge storage film. Consequently, since the request for miniaturization (creation of thinner devices is essential for restraining short channel effect) conflicts the request for securing reliability (in order to control leakage of stored electric charges, the thickness of an insulating film that separates a floating gate from the channel region or the well region cannot be decreased to smaller than approx. 7 nm), miniaturization of the device is difficult. In fact, according to ITRS (International Technology Roadmap for Semiconductors), miniaturization of a physical gate length down to approx. 0.2 micron or lower is not yet in sight.

In the memory element of the reference example, independent designing of the thicknesses T1 and T2 is available as described above, and therefore miniaturization becomes possible.

In the present invention, for example, in a memory cell with a gate electrode length (word line width) of 450 nm, there is separately set like T2=4 nm and T1=7 nm, fulfilling a semiconductor storage device free from generation of short channel effect. Short channel effect is not generated even though T2 is set larger than that of normal logic transistors, because the source/drain regions (the first and second diffusion regions 212, 213) are offset from the gate electrode 217.

Also, since the source/drain region is offset from the gate electrode in the memory element of the present invention, miniaturization is further facilitated compared to normal logic transistors.

As described above, since an electrode for supporting write and erase operation is not present above the first and second memory function bodies 261, 262, the insulating film, which separates the silicon nitride film 242 from the channel region or the well region of the P-type semiconductor substrate 211, does not directly receive the influence of high electric fields that affect in between the electrode that supports write and erase operation and the channel region or the well region, but receives influence only from relatively weak electric fields expanding from the gate electrode 217 in lateral direction. This makes it possible to fulfill a memory cell having the gate length miniaturized more than the gate length of the logic transistors in comparison with the same processing accuracy.

NINTH REFERENCE EXAMPLE

The ninth reference example of the present invention relates to changes of electric characteristics when rewrite operation is performed in the memory element of the semiconductor storage device.

Figure 19:
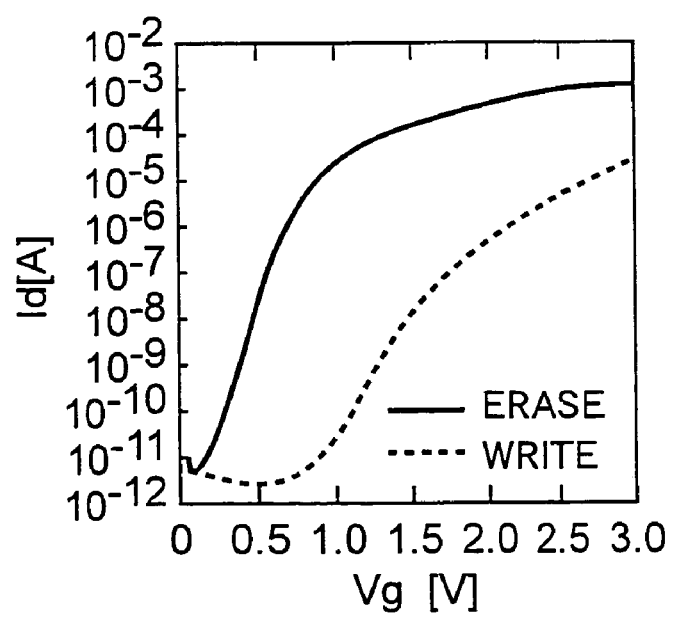
FIG. 19 is a graph showing the electrical characteristic of the memory element in the semiconductor storage device of a ninth reference example.

FIG. 19 is a view showing characteristic curves of a drain current Id versus a gate voltage Vg (measured values) where an electric charge amount in the memory function body of an N-channel type memory element.

Figure 32:
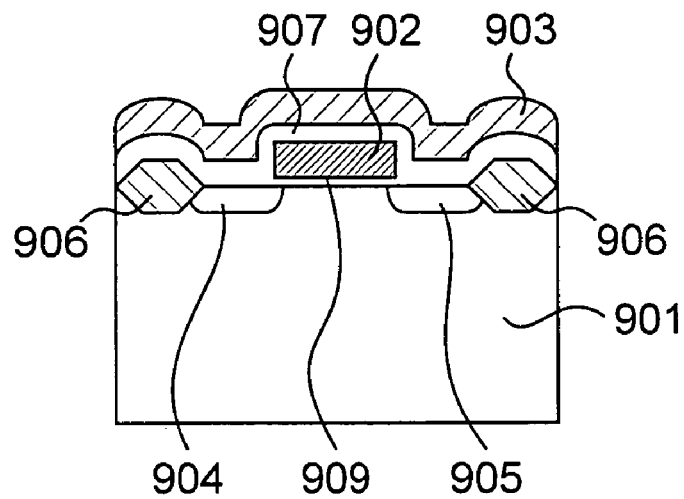
FIG. 32 is a schematic cross sectional view showing a conventional flash-memory device.
Figure 33:
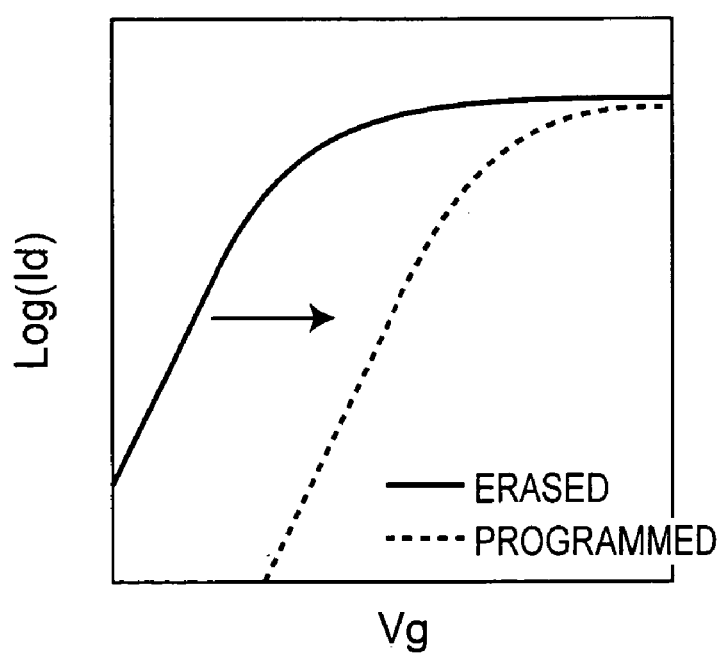
FIG. 33 is a graph view showing electric characteristics of the conventional flash-memory device.

As clearly shown in FIG. 19, when write operation is performed in the erased state as shown by a solid line, not only the threshold value simply rises, but inclination of the graph dramatically falls especially in sub-threshold region. Therefore, even in the region with relatively high gate voltage Vg, a drain current ratio of the erased state to the written state is large. For example in the point of Vg=2.5V, the current ratio is still two digits or more. This characteristic is largely different from that in the case of a flash memory shown in FIG. 32.

The appearance of the above characteristic in the memory element is a phenomenon peculiar to the case where the gate electrode and the diffusion region are offset and therefore the gate electric fields are difficult to reach the offset region. When the memory element is in the written state, an inversion layer is extremely difficult to be generated in the offset region below the memory function body even if a positive voltage is applied to the gate electrode. This causes smaller inclination of the Id-Vg curve line in the sub-threshold region in the written state.

When the memory element is in the erased state, high-density electrons are induced in the offset region. Further, when OV is applied to the gate electrode (i.e., in OFF state), electrons are not induced in the channel below the gate electrode (and therefore an off current is small). This causes large differential coefficient of the Id-Vg curve line in the sub-threshold region in the erased state and a large increase rate of current (conductance) even in the voltage region over the threshold.

As is clear from the above description, the memory element of the semiconductor storage device according to the present invention makes it possible to make the drain current ratio of the erased state to the written state particularly large.

First Embodiment

Figure 20:
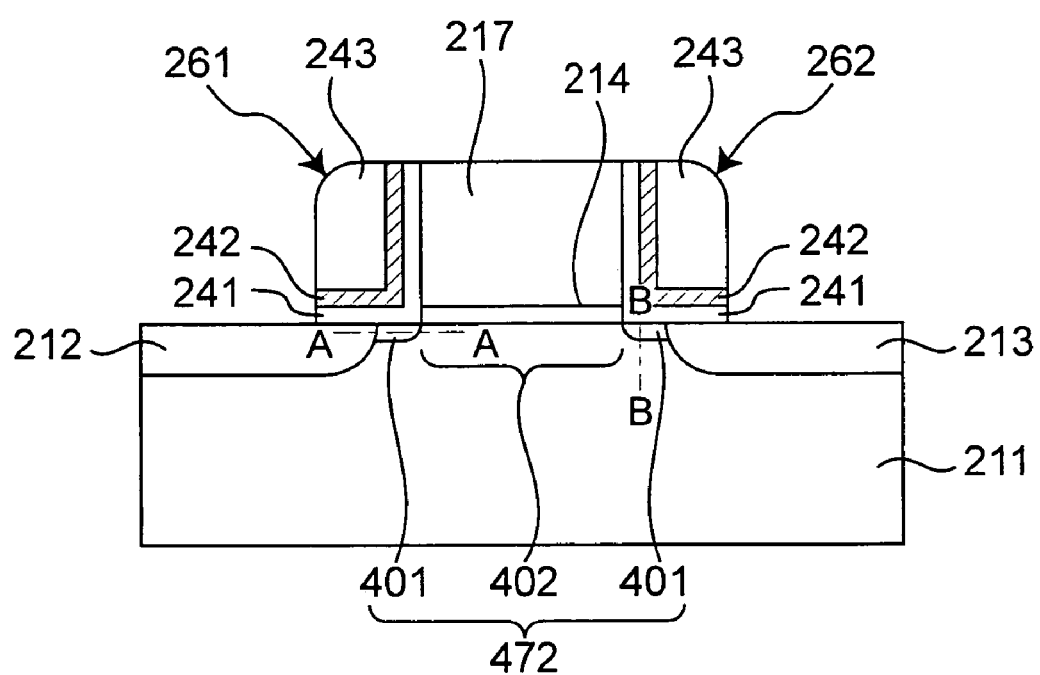
FIG. 20 is a schematic cross sectional view showing a memory element in a first embodiment of the present invention.

FIG. 20 is a schematic cross sectional view showing a memory element in the first embodiment of the present invention. In FIG. 20, the components identical to the components in the second reference example shown in FIG. 8 are designated by the reference numerals identical to those of the components in FIG. 8 and description thereof is omitted or given briefly.

The memory element in the first embodiment of the present invention is composed of, as shown in FIG. 20, a semiconductor substrate 211, a gate insulation film 214 formed on the semiconductor substrate 211, a single gate electrode 217 formed on the gate insulation film 214, a first memory function body 261 formed on one lateral side of the gate electrode 217, a second memory function body 262 formed on the other lateral side of the gate electrode 217, a P-type channel region 472 formed in a surface portion of the semiconductor substrate 211 on the side of the gate electrode 217, a first diffusion region 212 formed on one lateral side of the channel region 472 and an N-type second diffusion region 213 formed on the other lateral side of the channel region 472.

The first and second memory function bodies 261, 262 each have a silicon nitride 242 having a level to trap electric charge and silicon oxides 241, 243 sandwiching the silicon nitride 242 so as to prevent the electric charge stored in a charge retention film from dissipating. Particularly, the first and second memory function bodies 261, 262 each have a function to retain electric charge.

The channel region 472 is composed of an offset region 401 positioned under the first and second memory function bodies 261, 262 and a gate electrode beneath region 402 positioned under the gate electrode 217. The offset region 401 is formed on both sides of the gate electrode beneath region 402. Specifically, the offset region 401 are formed in the channel region 472 in the vicinity of the interface between the channel region 472 and the first and second memory function bodies 261, 262. The gate electrode beneath region 402 is formed in the channel region 472 in the vicinity of the interface between the channel region 472 and the gate insulation film 214. The concentration of a dopant which imparts a P-type conductivity to the offset region 401 is effectively lower than the concentration of a dopant which imparts the P-type conductivity to the gate electrode beneath region 402.

In the present invention, the semiconductor substrate 211 exemplifies the semiconductor layer, the offset region 401 exemplifies the first region, and the gate electrode beneath region 402 exemplifies the second region.

Thus, the memory element of the present embodiment is different from the memory element in the second reference example in FIG. 8 in the point that the channel region 472 is included. Specifically, in the memory element of the present embodiment, the offset regions 401 are each formed under the first and second memory function bodies 261, 262, and the gate electrode beneath region 402 is formed under the gate electrode 217. The memory element of the present embodiment is different from the memory element in the second reference example of FIG. 8 in the point that the concentration of the dopant which imparts the P-type conductivity to the offset region 401 is effectively lower than the concentration of the dopant which imparts the P-type conductivity to the gate electrode beneath region 402. In other words, the channel region 472 in the memory element of the present embodiment is replaced by the channel region 272 of the second reference example.

Figure 21:
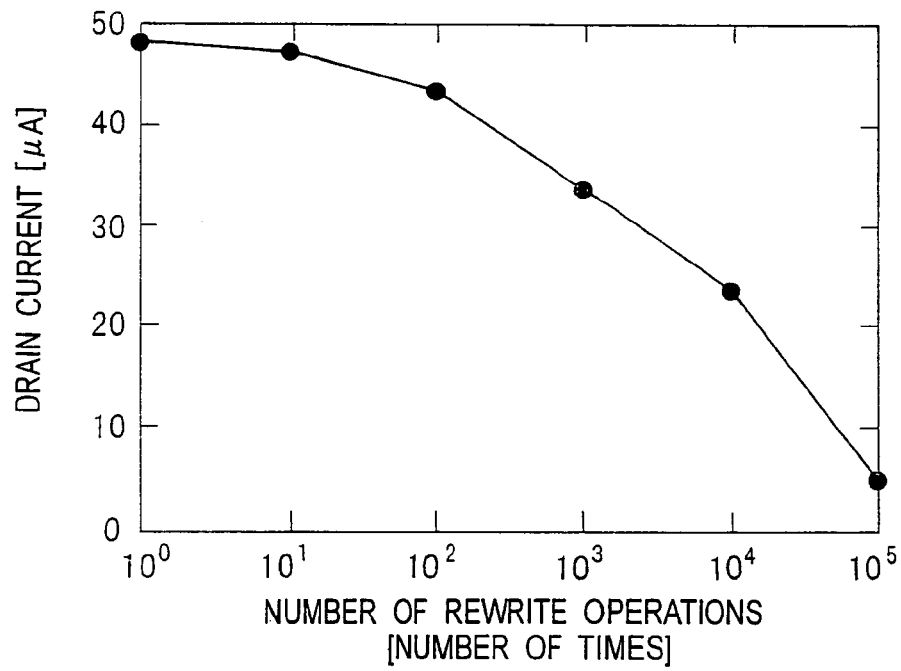
FIG. 21 is a graph view showing the relation between the drain current and the number of rewrite operations in the memory element in the second reference example.

FIG. 21 shows an example of the relation between the drain current and the number of rewrite operations after delete operation when the memory element in the second reference example repeats a write operation and a delete operation.

In the memory element in the second reference example, a series of rewrite operations composed of write operation and delete operation were performed for $10^5$ times. Thereafter, the drain current after the delete operation becomes approx. $1/10$ of the drain current before the rewrite operation. Then, a memory window (a difference between a drain current after the delete operation and a drain current after the write operation) decreases because the drain current after the delete operation decreases as stated above. Thus, as the number of rewrite operations increases, the memory window decreases, which causes reduction in the read speed, or limitation in the number of rewrite operations to maintain a specified read speed.

Decrease of the drain current, which is caused by repetition of the rewrite operation as shown in FIG. 21, is considered to be attributed to deterioration of a subthreshold coefficient and reduction of mutual conductance caused by interface states generated in the interface between silicon oxides and semiconductor substrates, charge traps generated in silicon oxides, and electrons remaining in silicon nitrides.

Figure 22:
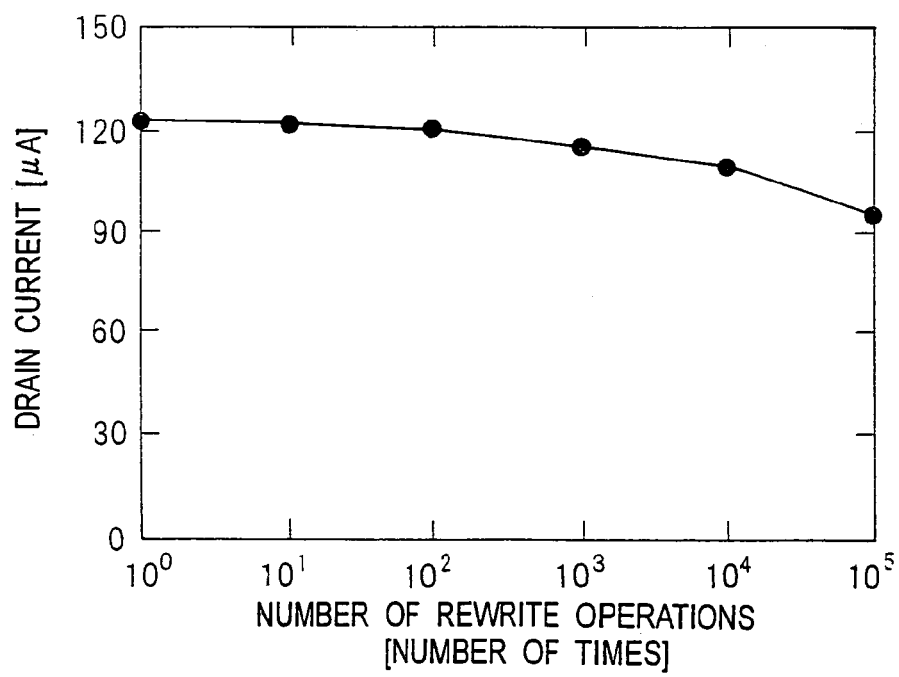
FIG. 22 is a graph view showing the relation between the drain current and the number of rewrite operations in the memory element in the first embodiment.

FIG. 22 shows an example of the relation between the drain current and the number of rewrite operations after delete operation when the memory element according to the present embodiment repeats write operation and delete operation.

In the memory element of the present embodiment, after a series of rewrite operation composed of write operation and delete operation was performed for $10^5$ times, the drain current after the delete operation becomes approx. 75% of the drain current before the rewrite operation. More particularly, in the memory element of the present embodiment, a rate of decrease in drain current after the delete operation is considerably improved up to approx. 25%.

Further, in the memory element of the present embodiment, a value of the drain current after the delete operation before the rewrite operation is repeated is considerably increased from that in the memory element in the second reference example. Specifically, while the drain current after the delete operation before the rewrite operation is repeated is 48 μA in the memory element in the second reference example, the drain current after the delete operation before the rewrite operation is repeated is 123 μA in the memory element of the present embodiment.

As is clear from the above result, by providing the channel region 472 of the present invention, decrease in the memory window due to the rewrite operation is suppressed so that the read speed is improved and the number of rewrite operations is increased.

Employing the device configuration shown in FIG. 20 allows not only suppression of the deterioration due to repetition of the rewrite operation but also suppression of the characteristic variation due to variation in the amount of offset attributed to the manufacturing process. The variation in the amount of offset attributed to the manufacturing process is herein caused by variation in thickness of the gate electrode sidewall film, variation in dopant diffusion due to variation in annealing condition or the like. Moreover, the characteristic variation is caused by variation in drain current (read current) during read operation. Therefore, even in the case where the amount of offset varies due to variation in manufacturing process, the characteristic variation can be suppressed. Thus, the yield of the semiconductor storage device can be improved by the present embodiment.

Providing the offset region 401 with a dopant concentration lower than that of the gate electrode beneath region 402 is equal to setting the dopant concentration in a portion of the channel region under the memory function body to be lower than the dopant concentration in a portion of the channel region under the gate electrode. In order to sufficiently maintain other characteristics of the memory element while suppressing deterioration of the memory element due to repetition of the rewrite operation, it is important to provide a region with a low dopant concentration not over the entire region of the channel region but only in the portion of the memory region under the memory function body. In other words, it is preferable that a portion of the channel region under the gate electrode region has a dopant concentration which is not lowered. In the case where the region with a low dopant concentration is provided over the entire region of the channel region, a threshold value of the memory element after the delete operation becomes too low, resulting in increase in off-leakage current. When the off-leakage current increases, in a memory cell array formed from integrated memory elements, the number of memory elements connected to bit lines is limited. Further, deterioration of the short-channel effect makes the scale shrinkage of the memory element difficult. Therefore, providing a region with a low dopant concentration over the entire region of the channel region becomes a factor to inhibit development of high-density semiconductor storage devices. Therefore, it is preferable to provide the region with a low dopant concentration only in a portion roughly under the memory function bodies.

Although in the present embodiment, the channel region 472 is used which is composed of the offset region 401 and the gate electrode beneath region 402, a channel region may be used in which a dopant concentration gradually increases from a region on the side of the diffusion region to a region under the gate insulation film. More particularly, a channel region may be used in which a P-type dopant concentration effectively increases from the PN junction between the channel region and the diffusion region to the region under the gate insulation film. In the case of using such a channel region, the same effect as that in the memory element of the present embodiment is achieved.

Description is now given of the case where the channel region with a dopant concentration gradually increasing from the region on the side of the diffusion region to the region under the gate insulation film is provided in the memory element of FIG. 20.

Figure 23:
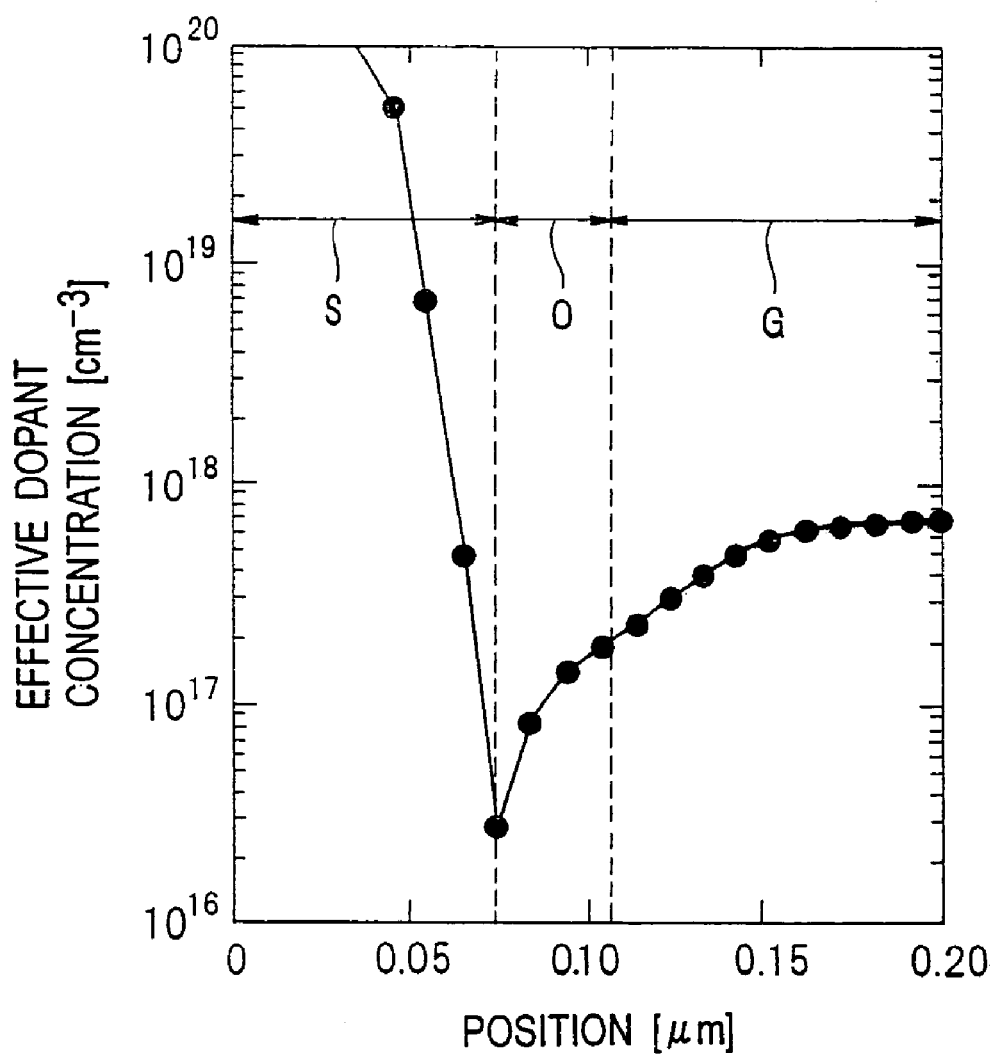
FIG. 23 is a graph view showing one example of the simulation result of an effective concentration profile along the line A-A in FIG. 20.

FIG. 23 shows one example of the simulation result of an effective concentration profile along the line A-A of FIG. 20. The effective concentration herein means $|N_D-N_A|$ wherein $N_D$ represents a concentration of a dopant which imparts an N-type conductivity and $N_A$ represents a concentration of a dopant which imparts a P-type conductivity. It is to be noted that in FIG. 23, the position in the range shown by an arrow S corresponds to the position in the first diffusion region 212. Moreover, in FIG. 23, the position in the range shown by an arrow O corresponds to the position in the offset region 401, and the position in the range shown by an arrow G corresponds to the position in the gate electrode beneath region 402. In other words, the regions shown by the arrows O and G in FIG. 23 correspond to the channel region. Also, in FIG. 23, the vertical axis represents an effective dopant concentration, the region shown by the arrow S is of N-type, and the regions shown by the arrow O and the arrow G are of P-type.

As is clear from FIG. 23, the dopant concentration $N_A$ which imparts the P-type conductivity to the channel region gradually increases from the PN junction between the channel region and the first diffusion region 212 to the region under the gate insulation film 214. Although unshown, the dopant concentration $N_A$ which imparts the P-type conductivity to the channel region also gradually increases from the PN junction between the channel region and the second diffusion region 213 to the region under the gate insulation film 214.

Figure 24:
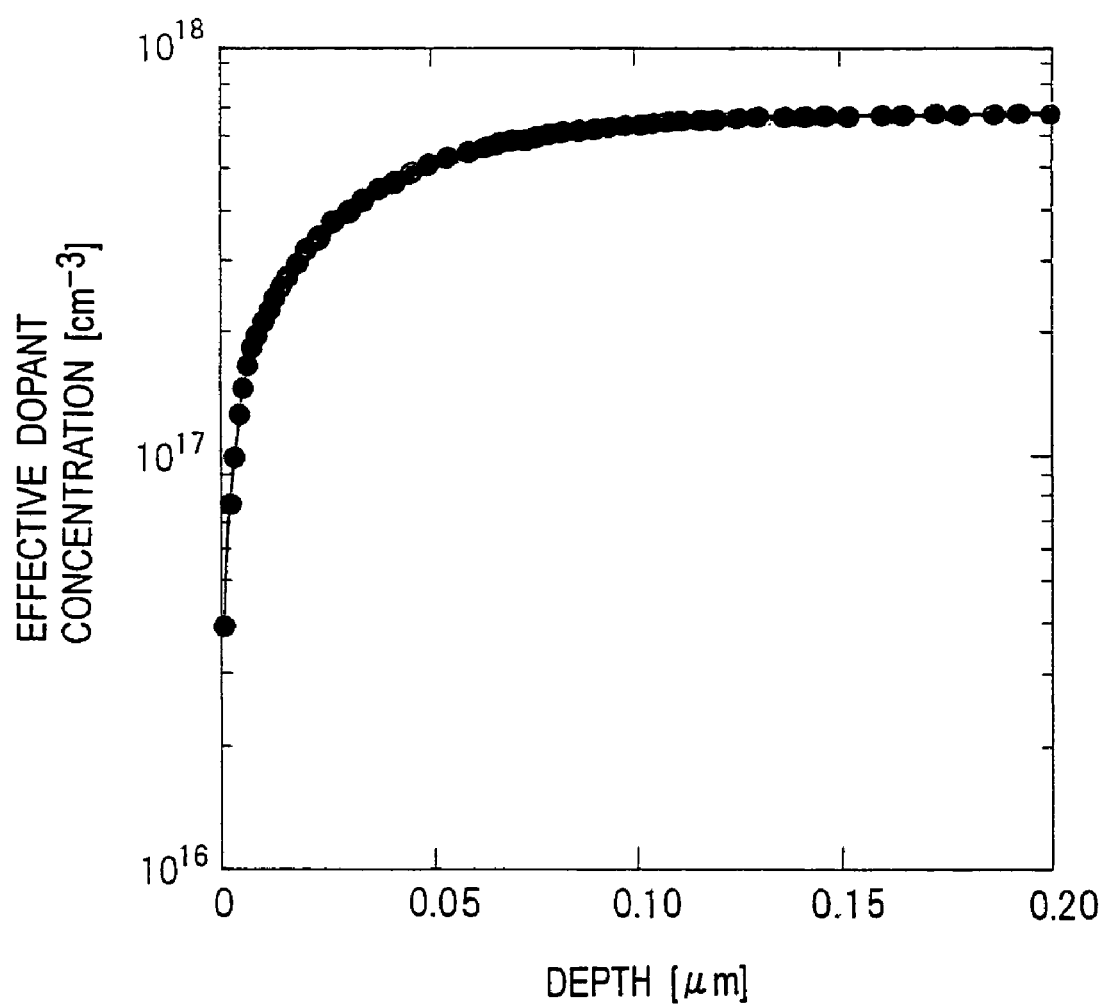
FIG. 24 is a graph view showing one example of the simulation result of an effective concentration profile along the line B-B in FIG. 20.

FIG. 24 shows one example of the simulation result of an effective concentration profile along the line B-B in FIG. 20;

As is clear from FIG. 24, the effective dopant concentration which imparts the P-type conductivity to the channel region gradually increases as the depth becomes larger. In other words, in a portion of the channel region under the second memory function body 262, the dopant concentration $N_A$ on the uppermost surface on the side of the second memory function body 262 is effectively the lowest. Although unshown, in a portion of the channel region under the second memory function body 262, the dopant concentration $N_A$ on the uppermost surface on the side of the first memory function body 261 is also effectively the lowest.

It is preferable to set the dopant concentration distribution in the channel region of the memory element shown in FIG. 20 in such a way as to deplete a portion of the channel region 472 under the first and second memory function bodies 261, 262 (offset region 401) in the case where potential of the gate electrode 217 and potential of the first and second diffusion regions 212, 213 are set to be equal, i.e., in the case of the off state. In this case, a depletion layer formed in the PN junction between the semiconductor substrate 211 and the first and second diffusion regions 212, 213 is connected to a depletion layer formed under the gate electrode 217 via the offset region 401 (region in the vicinity of the interface between the semiconductor substrate 211 and the first and second memory function bodies 261, 262). The dopant distribution to create such conditions is realized when the dopant concentration $N_A$ which imparts the P-type dopant concentration and the dopant concentration $N_D$ which imparts the N-type conductivity are almost equal in the vicinity of the offset region 401 (the effective dopant concentration in the vicinity of the offset region 401 is lower than that in the gate electrode beneath region 402). Under such conditions, the effects including increase in read speed, increase in number of rewrite operations and enhancement of the yield may be sufficiently achieved.

Also, in the case where the channel region with a dopant concentration gradually increasing from the region on the side of the diffusion region to the region under the gate insulation film is provided in the memory element of FIG. 20, it is preferable to set the dopant concentration distribution in the channel region in such a way as to at least partially deplete portions (offset regions 401) of the channel region under the first and second memory function bodies when potential of the gate electrode 217 is equal to potential of the first and second diffusion regions 212, 213.

In this embodiment, the concentration of the dopant which imparts the P-type conductivity to each section of the offset region 401 may be almost identical. Moreover, the concentration of the dopant which imparts the P-type conductivity to each section of the gate electrode beneath region 402 may also be almost identical.

Second Embodiment

Figure 25:
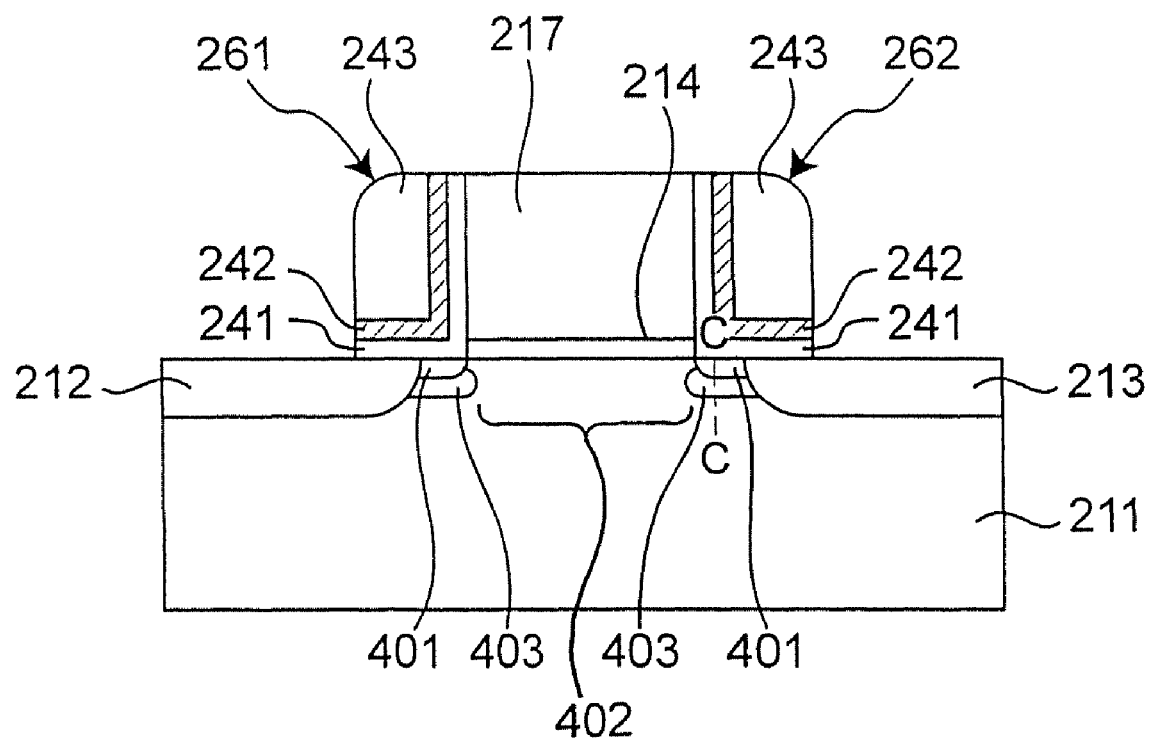
FIG. 25 is a schematic cross sectional view showing a memory element in a second embodiment of the present invention.

FIG. 25 shows a schematic cross sectional view of a memory element in the present invention. Moreover, in FIG. 25, the components identical to the components in the first embodiment shown in FIG. 20 are designated by the reference numerals identical to those of the components in FIG. 20, and description thereof is omitted.

The memory element in the present embodiment is different from the memory element in the first embodiment of FIG. 20 in the point that a P-type region 403 is provided immediately under the offset region 401. The concentration of a dopant which imparts the P-type conductivity to the region 403 is effectively higher than the concentration of a dopant which imparts the P-type conductivity to the gate electrode beneath region 402. Moreover, the region 403 is in contact with the bottom portion of the offset region 401. Such a region 403 exemplifies the third region.

Figure 26:
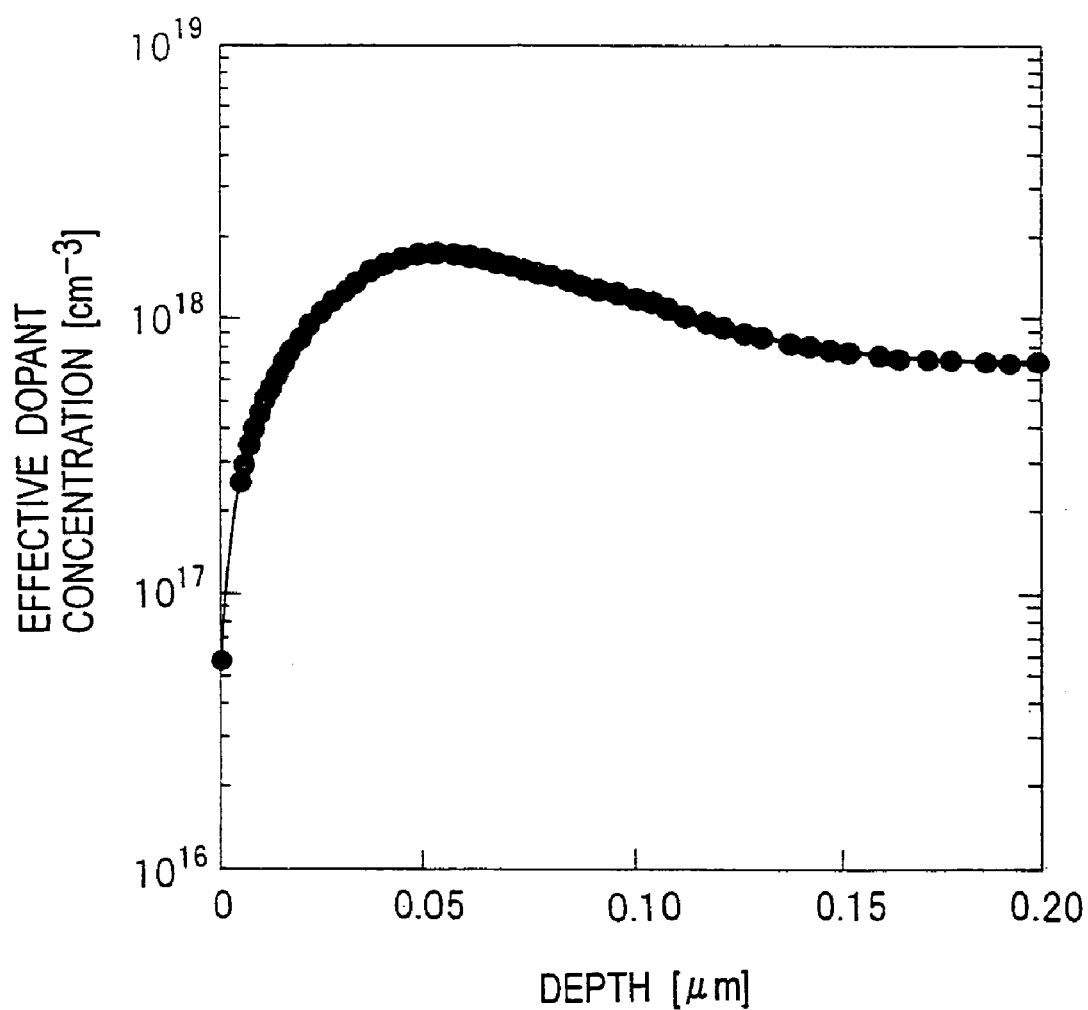
FIG. 26 is a graph view showing one example of the simulation result of an effective concentration profile along the line C-C in FIG. 25.

FIG. 26 shows one example of the simulation result of an effective concentration profile along the line C-C in FIG. 25.

As is clear from FIG. 26, in a portion located on the lateral side of the second diffusion region 213 under the second memory function body 262, the effective dopant concentration on the uppermost surface of the semiconductor substrate 211 on the side of the second memory function body 262 is the lowest. Moreover, in this portion, the effective concentration of the dopant which imparts the P-type conductivity gradually increases as the depth becomes larger, and the effective concentration of the dopant becomes the largest in the vicinity of the depth of 0.05 µm before gradually decreasing. In the vicinity of the depth 0.05 µm, the region 403 under the second memory function body 262 is provided. Although unshown, in a portion located on the lateral side of the first diffusion region 212 under the second memory function body 262, the effective dopant concentration exhibits changes identical to those of FIG. 26. The region 403 under the first memory function body 261 is also provided in the vicinity of the depth 0.05 µM from the uppermost surface of the semiconductor substrate 211 on the side of the second memory function body 262.

By providing such a region 403 under the first and second memory function bodies 261, 262, potential gradient of the PN junction in a relatively shallow portion inside the semiconductor substrate 211 becomes steep so that the generation efficiency of hot carriers during the rewrite operation may be enhanced. Therefore, both the suppression of deterioration attributed to repetition of the rewrite operation and high-speed rewrite operation may be achieved.

It is to be noted that in the profile taken in the depth direction of the semiconductor substrate 211, the depth corresponding to a peak value of the effective dopant concentration should preferably be 10 nm to 80 nm (0.01 µm to 0.08 μm) from the interface between the semiconductor substrate 211 and the silicon oxide 241.

If the depth corresponding to a peak value of the effective dopant concentration is less than 10 nm, then it becomes difficult to have a sufficiently low effective dopant concentration in the vicinity of the channel (uppermost surface), and so the deterioration attributed to repetition of the rewrite operation cannot be sufficiently suppressed.

If the depth corresponding to a peak value of the effective dopant concentration is beyond 80 nm, then hot carriers generated in the vicinity of the depth corresponding to the peak value of the effective dopant concentration are scattered before reaching the silicon nitride 242, thereby making reduction in rewrite speed unignorable.

Therefore, setting the depth corresponding to a peak value of the effective dopant concentration to be within the range of 10 nm to 80 nm makes it possible to achieve both the high-speed rewrite operation and the suppression of deterioration attributed to repetition of the rewrite operation.

Figure 27A:
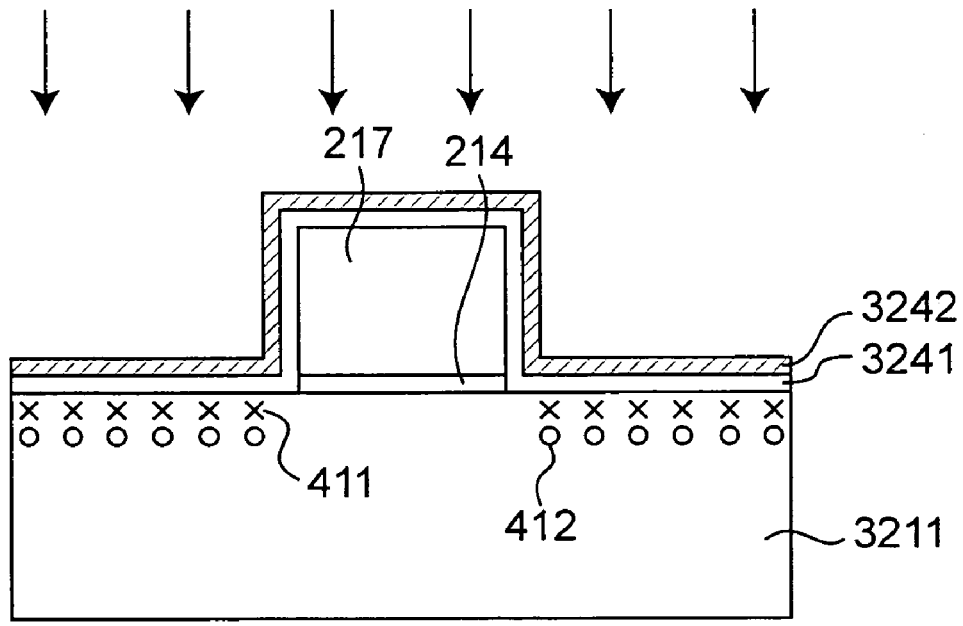
FIG. 27A is a view for explaining a formation method for the memory element in the second embodiment.
Figure 27B:
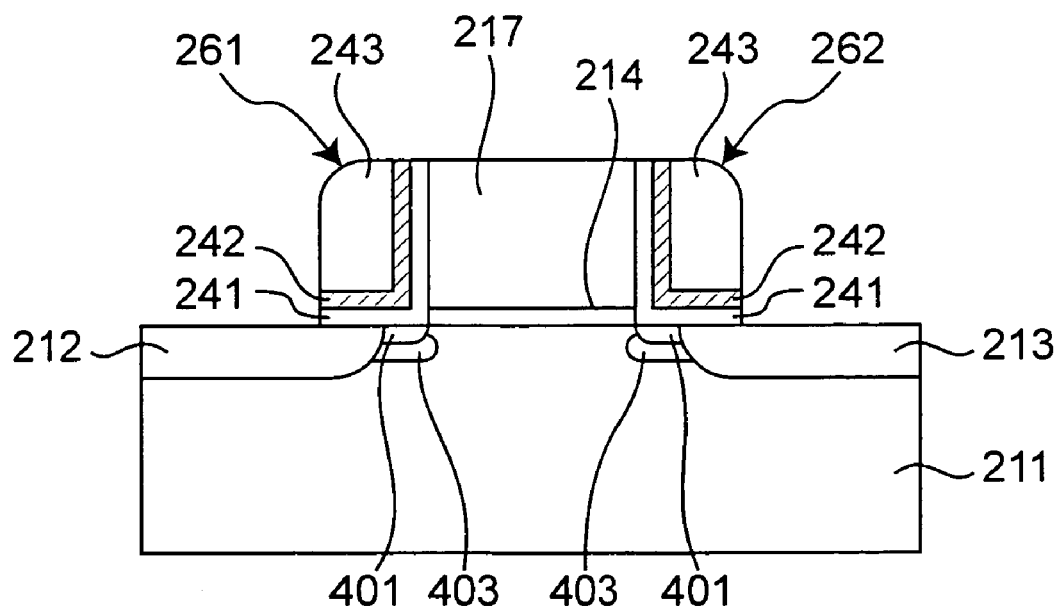
FIG. 27B is a view for explaining a formation method for the memory element in the second embodiment.

Description is now given of a formation method for the memory element in the present embodiment with reference to FIGS. 27A and 27B. It is to be noted that since the outline of the formation method for most parts of the memory element has already been described, the procedures for forming the offset region 401 and the region 403 will mainly be described hereinbelow.

First, by an known method, a gate insulation film 214 and a gate electrode 217 are formed on a P-type semiconductor substrate 3211, as shown in FIG. 27A.

Next, a dopant 411 which imparts an N-type conductivity and a dopant 412 which imparts a P-type conductivity are injected into the entire surface of the semiconductor substrate 3211 on the side of the gate electrode 217. In this case, the dopant 411 which imparts the N-type conductivity is injected more shallowly than the dopant 412 which imparts the P-type conductivity.

The dopant which imparts the N-type conductivity includes, for example, $^{75}As^+$. The dopant $^{75}As^+$ may be injected into the semiconductor substrate 3211 under the conditions that injection energy is 1 KeV to 40 KeV and an injection amount is $5\times10^{12}$ to $1\times10^{14}$ cm$^{-2}$.

Moreover, the dopant which imparts the P-type conductivity includes, for example, $^{11}B^+$. The dopant $11B^+$ may be injected into the semiconductor substrate 3211 under the conditions that injection energy is 500 eV to 20 KeV and an injection amount is $5\times10^{12}$ to $1\times10^{14}$ cm$^{-2}$.

It is to be noted that it is more preferable to inject $^{122}Sb^+$ (antimony) as an example of the dopant which imparts the N-type conductivity into the semiconductor substrate 3211. The antimony is large in mass so that the diffusion distance is small, and therefore is suitable to decrease the effective dopant concentration in the vicinity of the surface of the semiconductor substrate 3211 on the side of the gate electrode 217.

Moreover, by using $^{122}Sb^+$ as an example of the dopant which imparts the N-type conductivity, it becomes possible to generate the peak value of the effective dopant concentration in a shallower portion. Therefore, the dopant $^{122}Sb^+$ is particularly effective for achieving both the high-speed rewrite operation and the suppression of deterioration attributed to repetition of the rewrite operation. The dopant injection into the semiconductor substrate 3211 is performed with the gate electrode 217 as a mask, and the dopant is injected in a self-aligning way only into the places where the gate electrode 217 is not present.

The dopant injection should be performed after the gate electrode 217 is formed and before the gate electrode sidewalls (first and second memory function bodies 261, 262) are formed. In FIG. 27A, the injection is performed after a silicon oxide 3241 and a silicon nitride 3242 are formed on the entire surface of the semiconductor substrate 3211 on the side of the gate electrode 217.

It is to be noted that if the dopant injection is performed in the state that the silicon oxide 3241 is not yet formed after the gate electrode 217 is formed, diffusion of the dopant in the depth direction can be suppressed, which is beneficial for both the suppression of deterioration attributed to repetition of the rewrite operation and the high-speed rewrite operation.

Moreover, as shown in FIG. 27A, performing the dopant injection after formation of the silicon nitride 3242 makes it possible to prevent contamination of the silicon oxide 243 (see FIG. 25 or FIG. 27B), which suppresses dissipation of electric charge stored in the silicon nitride 242, thereby allowing the retention characteristics of the memory element to be enhanced.

Next, as shown in FIG. 27B, the gate electrode sidewalls (first and second memory function bodies 261, 262) are formed, and the first and second diffusion regions 212, 213 are formed. Through these processes, the dopant 411 which imparts the N-type conductivity and the dopant 412 which imparts the P-type conductivity are diffused and activated so that the offset region 401 and the region 403 are formed.

It is to be noted that the dopant 411 which imparts the N-type conductivity offsets the dopant which exists in the semiconductor substrate 3211 by nature and imparts the P-type conductivity, so that the effective dopant concentration is reduced.

In the formation method, injecting only the dopant 411 which imparts the N-type conductivity into the entire surface of the semiconductor substrate 3211 on the side of the gate electrode 217 allows formation of the memory element in the first embodiment of FIG. 20.

Third Embodiment

Figure 28:
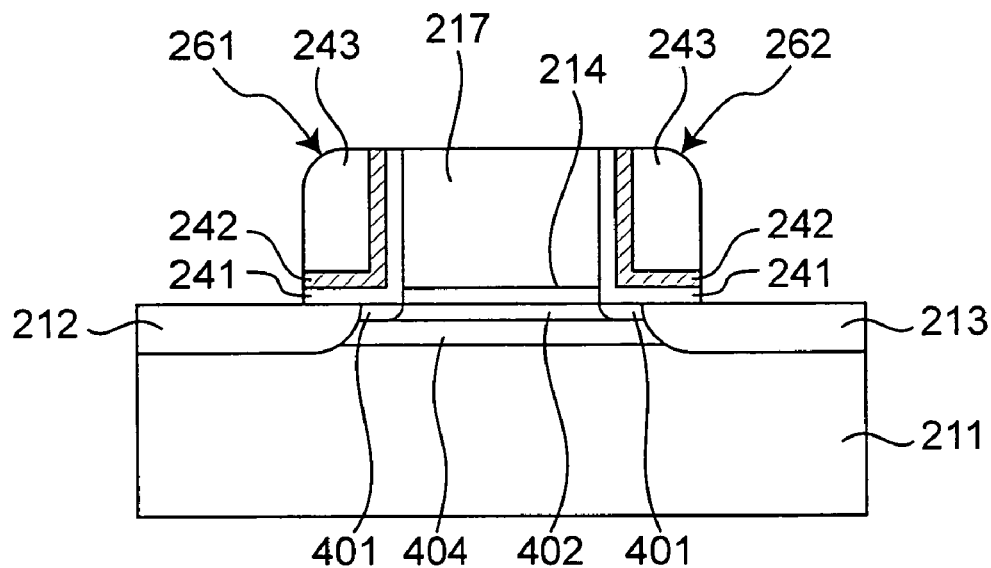
FIG. 28 is a schematic cross sectional view showing a memory element in a third embodiment of the present invention.

FIG. 28 shows a schematic cross sectional view of a memory element in a third embodiment of the present invention. In FIG. 28, the components identical to the components in the first embodiment shown in FIG. 20 are designated by the reference numerals identical to those of the components in FIG. 20, and description thereof is omitted.

The memory element in the present embodiment is different from the memory element in the first embodiment of FIG. 20 in the point that a P-type region 404 is provided immediately under the offset region 401 and the gate electrode beneath region 402. The concentration of a dopant which imparts the P-type conductivity to the region 404 is effectively higher than the concentration of a dopant which imparts the P-type conductivity to the gate electrode beneath region 402. Moreover, the region 404 is in contact with the bottom portion of the offset region 401 and the gate electrode beneath region 402. A portion of such a region 404 under the first and second memory function bodies 261, 262 exemplifies the third region.

With the device configuration of the memory element in the present embodiment, both the high-speed rewrite operation and the suppression of deterioration attributed to repetition of the rewrite operation may be achieved as with the second embodiment.

Further, the short-channel effect is effectively suppressed by providing the region 404 in the offset region 401 and the gate electrode beneath region 402, which facilitates scale shrinkage of the memory element.

Fourth Embodiment

Figure 29:
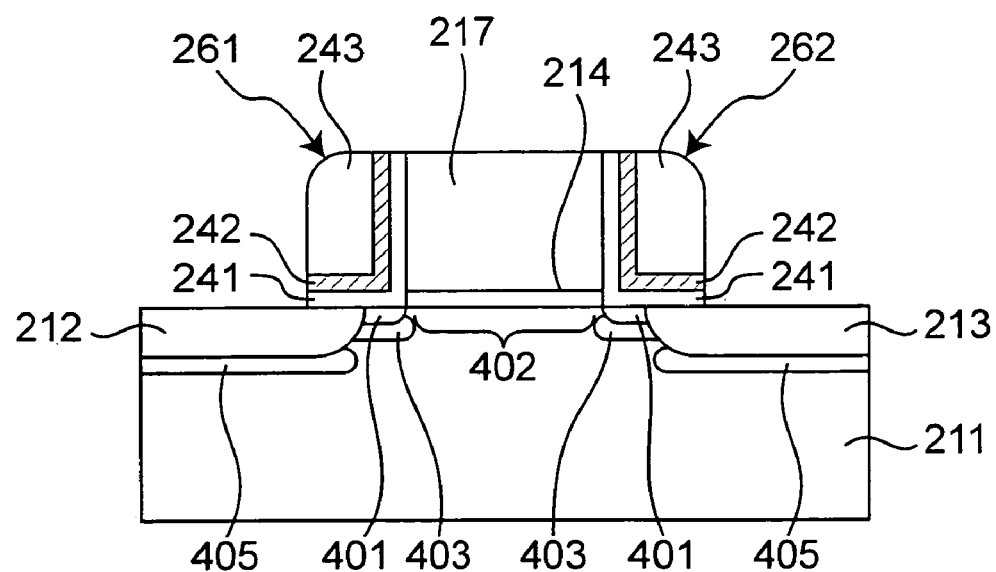
FIG. 29 is a schematic cross sectional view showing a memory element in a fourth embodiment of the present invention.

FIG. 29 shows a schematic cross sectional view of a memory element in a fourth embodiment of the present invention. In FIG. 29, the components identical to the components in the second embodiment shown in FIG. 25 are designated by the reference numerals identical to those of the components in FIG. 25, and description thereof is omitted.

The memory element in the present embodiment is different from the memory element in the second embodiment of FIG. 25 in the point that a P-type region 405 is provided immediately under the first and second diffusion regions 212, 213. The concentration of a dopant which imparts the P-type conductivity to the region 405 is effectively lower than the concentration of a dopant which imparts the P-type conductivity to the gate electrode beneath region 402. Moreover, the region 405 is in contact with the bottom portion of the first and second diffusion regions 212, 213. Such a region 405 exemplifies the fourth region.

By employing such device configuration as the above, the memory element in the present embodiment can accomplish drastic reduction of a junction capacitance with respect to the first and second diffusion regions 212, 213, so that the high-speed read operation can be achieved. Therefore, the suppression of deterioration attributed to repetition of the rewrite operation, the high-speed rewrite operation and the high-speed read operation may be realized.

Fifth Embodiment

Figure 30:
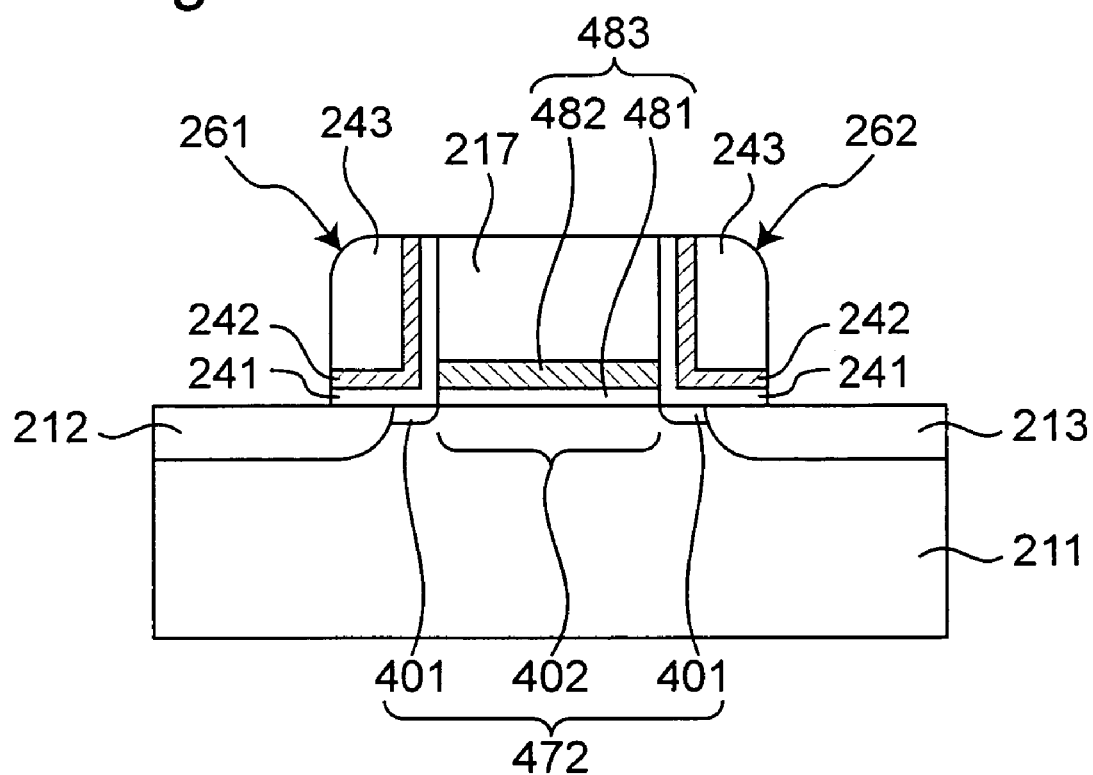
FIG. 30 is a schematic cross sectional view showing a memory element in a fifth embodiment of the present invention.

FIG. 30 shows a schematic cross sectional view of a memory element in a fifth embodiment of the present invention. In FIG. 30, the components identical to the components in the first embodiment shown in FIG. 20 are designated by the reference numerals identical to those of the components in FIG. 20, and description thereof is omitted.

The memory element in the present embodiment is different from the memory element in the first embodiment of FIG. 20 in the point that the gate insulation film includes a high dielectric film (a dielectric film larger in dielectric constant than a silicon oxide). This makes the scale shrinkage of the memory element in the present embodiment easier than that of the memory element in the first embodiment. The reason thereof will be described below.

In the semiconductor storage device of the present embodiment, the memory function bodies are formed independently of the gate insulation film. Therefore, it becomes possible to reduce the thickness of the gate insulation film to suppress the short-channel effect, which makes the scale shrinkage easier than that in the conventional semiconductor storage device. However, the gate insulation film needs to withstand the voltage during the rewrite operation, and so the thickness of the gate insulation film has a lower limit. The lower limit of the gate insulation film stipulates the limit of scale shrinkage of the semiconductor storage device in the present invention.

Accordingly, in the memory element of the present embodiment, a gate insulation film 483 includes a high dielectric film 482. This makes it possible to decrease the thickness of an equivalent oxide of the gate insulation film 483 (the thickness of a silicon oxide when the same electrostatic capacity is realized with use of the silicon oxide) while keeping the physical film thickness.

Therefore, it becomes possible to further suppress the short-channel effect by decreasing the thickness of the equivalent oxide while keeping the voltage withstand level of the gate insulation film 483. As a result, the semiconductor storage device of the present invention which is easily shrunk in scale compared to the conventional semiconductor storage device can be further shrunk in scale in a dramatic way.

Further, in the memory element of the present embodiment, the gate insulation film 483 including the high dielectric film 482 decreases the thickness of the equivalent oxide of the gate insulation film 483 (i.e., decreases the electrostatic capacity of the gate insulation film 483), so that the charge density in an inversion layer may be increased, allowing drastic increase in drain current (read current) after the delete operation compared to the memory element in the first embodiment of FIG. 20. Therefore, the read operation speed of the memory element in the present embodiment may be increased.

While the gate insulation film 483 may be made of a single-layered high dielectric film, the gate insulation film 483 is more preferably made of a laminated film composed of an interface transition layer (low dielectric film) 481 and a high dielectric film 482. The high dielectric film 482 may be formed from, for example, a hafnium compound. Moreover, as the interface transition layer (low dielectric film) 481, silicon oxide and silicon nitride may be used for example.

In the case of using the hafnium compound as a material of the gate insulation film 483, a high dielectric constant may be maintained even with the scale shrinkage of the memory element. In this point, the hafnium compound is superior to other materials.

As is described, the gate insulation film 483 including the hafnium compound makes it possible to maintain a high dielectric constant even with the scale shrinkage of the memory element, so that a high drain current can be obtained in particularly miniscule memory elements. This characteristic is particularly preferable in the memory elements. The reason thereof will be described below.

In the memory element, the delete operation decreases a threshold value in the offset region 401 portion (decreases the channel resistance of the offset region 401 portion), and increases the drain current. While the channel resistance in the offset region 401 portion may be further decreased by lengthening the time of the delete operation, it is not possible to increase the drain current without any limitation. This is because the channel resistance in the gate electrode beneath region 402 portion functions as major resistance to limit the drain current as the channel resistance in the offset region 401 portion becomes larger. More particularly, in order to increase the drain current, the channel resistance in the gate electrode beneath region 402 portion should be decreased. The decrease in channel resistance in the gate electrode beneath region 402 portion may be realized by the hafnium compound. More particularly, in the case of using the hafnium compound as a material of the gate insulation film 483, the charge density in the inversion layer of the gate electrode beneath region 402 increases in spite of the scale shrinkage of the memory element, which allows the channel resistance in the gate electrode beneath region 402 portion to be decreased. Therefore, by using the hafnium compound as a material of the gate insulation film 483, it becomes possible to increase the read current and achieve the high-speed read operation even when the memory element is shrunk in scale.

Further, since the hafnium compound has high thermal stability, it has high compatibility with the process using a polysilicon gate. Therefore, using the hafnium compound as a material of the high dielectric film 482 facilitates the manufacturing process.

The hafnium compound includes, specifically, hafnium oxide ($HfO_2$), hafnium silicate (HfSiO, HfSiON) and hafnium aluminum oxide (HfAlO). It is to be noted that a ratio of each element should be optimized so as to obtain desired characteristics. For example, in the case of using hafnium oxide as a material of the gate insulation film 483, the dielectric constant of the gate insulation film 483 may be set relatively high (the dielectric constant of the gate insulation film may be set at, for example, 20), which makes it possible to increase the effect of increasing the read current. Moreover, in the case of using hafnium silicate as a material of the gate insulation film 483, it becomes easier to suppress reaction of the semiconductor substrate 211 with silicon atoms, which allows suppression of a leakage current. Furthermore, in the case of using hafnium aluminum oxide, the thermal stability is further enhanced, which further facilitates the manufacturing process.

Moreover, in the case where the gate insulation film 483 is made of a laminated film composed of the interface transition layer (low dielectric film) 481 and the high dielectric film 482, it becomes possible to keep the interface between the gate insulation film 483 and the semiconductor substrate 211 at high quality while decreasing an equivalent oxide thickness of the gate insulation film. More particularly, charge mobility can be enhanced and deterioration of the interface can be suppressed compared to the case where the high dielectric and the semiconductor substrate are in direct contact with each other. Therefore, the read operation speed of the memory element may be increased and the reliability may be enhanced.

In the case where the high dielectric film 482 is formed from hafnium oxide and the interface transition layer 481 is a silicon oxide, it becomes possible to set, for example, the thickness of the high dielectric film 482 at 10 nm and the thickness of the interface transition layer 481 at 1 nm, though the thickness is not limited thereto.

It is to be noted that in the fourth embodiment, the interface transition layer 481 exemplifies the first insulation film and the high dielectric film 482 exemplifies the second insulation film.

Sixth Embodiment

Figure 31:
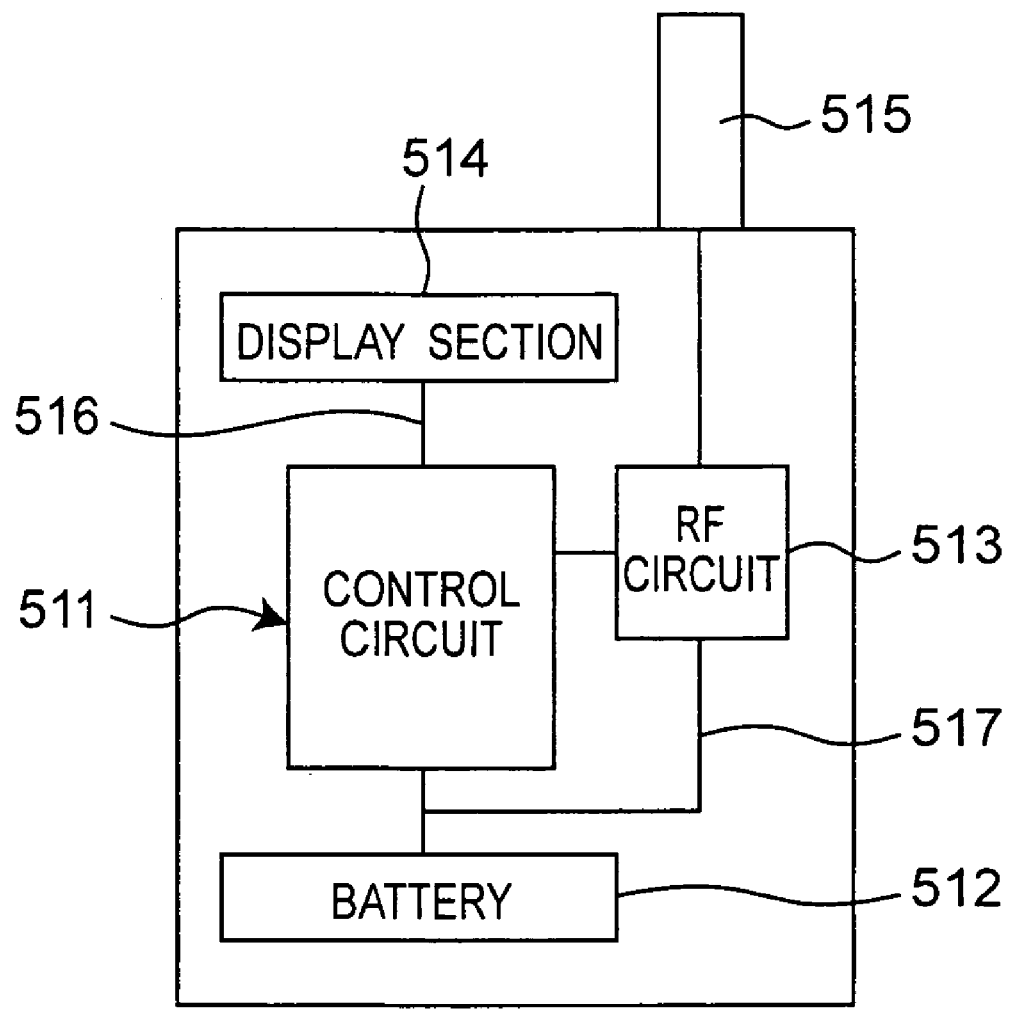
FIG. 31 is a schematic block diagram showing a portable telephone in a sixth embodiment of the present invention.

FIG. 31 shows a schematic block diagram of a portable telephone as one example of the portable electronic equipment of the present invention.

This portable telephone is constituted essentially of a control circuit 511, a battery 512, an RF (Radio Frequency) circuit 513, a display section 514, an antenna 515, a signal line 516 and a power line 517. A semiconductor storage device containing the memory element according to any one of the first to fifth embodiments is incorporated in the control circuit 511. The control circuit 511 should preferably be an integrated circuit where devices of an identical structure are concurrently used as memory circuit elements and logic circuit elements. This facilitates the manufacturing of integrated circuits and allows the manufacturing cost of the portable electronic equipment to be especially reduced.

As described above, by employing the semiconductor storage device that facilitates the fabricating process for the memory section and the logic circuit section in combination, that is easy to miniaturize, and that allows a high speed read operation, it is possible to improve the reliability and operating speed of the portable electronic equipment, reduce the size of the portable electronic equipment, and reduce the production costs.

Although the P-type semiconductor substrate 211 is used in the first to sixth embodiments, an N-type semiconductor substrate may be used. In the case where an memory element with use of the N-type semiconductor substrate is formed, a P-type well region is formed on the surface of the N-type semiconductor substrate on the gate electrode, and a channel region is formed in the P-type well region.

Although the N channel type memory element is explained in the first to sixth embodiments, the present invention is not limited to the N channel type memory element. That is to say, the memory element of the present invention may be of P channel type. For example, the P channel type memory element is obtained by using the conductive types opposite to those of the components in the memory element of the first to sixth embodiments, that is, by changing P-type into N-type and N-type into P-type. Also, both N-type and P-type N-type semiconductor substrates may be used for a P channel type memory element. In the case where the P channel type memory element is formed by using the P-type semiconductor substrate, the N-type well region is formed in the surface of the substrate on the side of the gate electrode, and then, the channel region is formed in the N-type well region.

It is also possible to combine the first to the ninth reference examples with the first to sixth embodiments as an semiconductor storage device of the present invention. Specifically, as an example of the present invention, it is possible to provide one of the first to ninth reference examples with the offset region 401, the gate electrode beneath region provides 402 and at least one of regions 403-405. The service conditions, design conditions and definitions employed in the first to ninth reference examples may be used in the first to sixth embodiments.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A semiconductor storage device comprising:
    a semiconductor layer;
    a gate insulation film formed on the semiconductor layer
    a single gate electrode, wherein said single gate electrode is formed on the gate insulation film as a word line;
    a memory function body that is formed on both sides of the gate electrode and has a function to retain electric charge;
    a first conductivity-type channel region formed in a surface portion of the semiconductor layer on a side of the gate electrode;
    a second conductivity-type diffusion region formed on both sides of the channel region;
    a first conductivity-type first region formed in the channel region in a vicinity of an interface between the channel region and the memory function body; and
    a first conductivity-type second region formed in the channel region in a vicinity of an interface between the channel region and the gate insulation film, wherein a concentration of a dopant which imparts the first conductivity type to the first region is effectively lower than a concentration of a dopant which imparts the first conductivity type to the second region.

2. A semiconductor storage device comprising:
a semiconductor layer;
a gate insulation film formed on the semiconductor layer
a single gate electrode, wherein said single gate electrode is formed on the gate insulation film;
a memory function body formed on both sides of the gate electrode and having a function to retain electric charge;
a first conductivity-type channel region formed in a surface portion of the semiconductor layer on a side of the gate electrode; and
a second conductivity-type diffusion region formed on both sides of the channel region, wherein
a concentration of a dopant which imparts the first conductivity type to the first region gradually increases starting from a PN junction between the channel region and the diffusion region toward a region under the gate insulation film.

3. A semiconductor storage device comprising:
a semiconductor layer;
a gate insulation film formed on the semiconductor layer;
a single gate electrode, wherein said single gate electrode is formed on the gate insulation film;
a memory function body that is formed on both sides of the gate electrode and has a function to retain electric charge;
a first conductivity-type channel region formed in a surface portion of the semiconductor layer on a side of the gate electrode; and
a second conductivity-type diffusion region formed on both sides of the channel region, wherein
when potential of the gate electrode and potential of the diffusion region are set to be equal, a depletion layer formed in a PN junction between the channel region and the diffusion region and a depletion layer formed under the gate electrode are connected in a vicinity of an interface between the channel region and the memory function body.

4. The semiconductor storage device as defined in claim 1, further comprising
a third region formed under the first region so as to be in contact with the first region, wherein
a concentration of a dopant which imparts the first conductivity type to the third region is effectively higher than the concentration of the dopant which imparts the first conductivity type to the second region.

5. The semiconductor storage device as defined in claim 4, wherein
a concentration of a dopant which imparts the first conductivity type to a portion of the third region with a depth of 10 nm to 80 nm is effectively higher than a concentration of a dopant which imparts the first conductivity type to other portions of the third region.

6. Semiconductor storage device as defined in claim 4, further comprising
a fourth region formed under the diffusion region so as to be in contact with the diffusion region, wherein
a concentration of a dopant which imparts the first conductivity type to the fourth region is effectively lower than the concentration of the dopant which imparts the first conductivity type to the second region.

7. The semiconductor storage device as defined in claim 1, wherein
the gate insulation film includes a dielectric film larger in dielectric constant than a silicon oxide.

8. The semiconductor storage device as defined in claim 2, wherein
the gate insulation film includes a dielectric film larger in dielectric constant than a silicon oxide.

9. The semiconductor storage device as defined in claim 3, wherein
the gate insulation film includes a dielectric film larger in dielectric constant than a silicon oxide.

10. The semiconductor storage device as defined in claim 7, wherein
the dielectric film is made of a hafnium compound.

11. A manufacturing method for the semiconductor storage device as defined in claim 1, comprising the steps of:
forming the gate electrode;
injecting a dopant imparting the second conductivity-type into the semiconductor layer; and
forming the memory function body.

12. A manufacturing method for the semiconductor storage device as defined in claim 4, comprising the steps of:
forming the gate electrode;
injecting a dopant imparting the first conductivity-type into the semiconductor layer while injecting a dopant imparting the second conductivity-type into the semiconductor layer so as to be smaller in thickness than the dopant imparting the first conductivity-type; and
forming the memory function body.

13. The manufacturing method for the semiconductor storage device as defined in claim 11, wherein
the dopant imparting the second conductivity-type is antimony.

14. The manufacturing method for the semiconductor storage device as defined in claim 12, wherein
the dopant imparting the second conductivity-type is antimony.

15. Portable electronic equipment comprising the semiconductor storage device as defined in claim 1.

16. Portable electronic equipment comprising the semiconductor storage device as defined in claim 2.

17. Portable electronic equipment comprising the semiconductor storage device as defined in claim 3.

* * * * *